United States Patent
Rudolph et al.

(10) Patent No.: US 7,335,397 B2
(45) Date of Patent: Feb. 26, 2008

(54) PRESSURE GRADIENT CVI/CVD APPARATUS AND METHOD

(75) Inventors: James W. Rudolph, Colorado Springs, CO (US); Paul T. Perea, Pueblo West, CO (US); John S. Linck, Pueblo, CO (US); Chris T. Kirkpatrick, Pueblo West, CO (US); Richard Jones, Tipp City, OH (US)

(73) Assignee: Goodrich Corporation, Charlotte, NC (US)

( * ) Notice: Subject to any disclaimer, the term of this patent is extended or adjusted under 35 U.S.C. 154(b) by 270 days.

(21) Appl. No.: 10/780,265

(22) Filed: Feb. 16, 2004

(65) Prior Publication Data
US 2005/0178327 A1    Aug. 18, 2005

(51) Int. Cl.
*C23C 16/00* (2006.01)

(52) U.S. Cl. .............. 427/248.1; 427/255.12; 427/900

(58) Field of Classification Search .......... 427/248.1, 427/255.12, 900
See application file for complete search history.

(56) References Cited

U.S. PATENT DOCUMENTS

| | | | | |
|---|---|---|---|---|
| 4,134,360 A | | 1/1979 | Fisher et al. | 118/728 |
| 4,212,906 A | | 7/1980 | Fisher et al. | 427/237 |
| 4,580,524 A | | 4/1986 | Lackey, Jr. et al. | 118/725 |
| 4,790,052 A | | 12/1988 | Olry | 28/110 |
| 4,895,108 A | | 1/1990 | Caputo et al. | 118/728 |
| 5,348,774 A | * | 9/1994 | Golecki et al. | 427/543 |
| 5,480,678 A | | 1/1996 | Rudolph et al. | 427/248.1 |
| 5,853,485 A | | 12/1998 | Rudolph et al. | 118/715 |
| 5,904,957 A | * | 5/1999 | Christin et al. | 427/248.1 |
| 6,109,209 A | * | 8/2000 | Rudolph et al. | 118/724 |
| 6,780,462 B2 | * | 8/2004 | Purdy et al. | 427/248.1 |
| 6,942,893 B2 | * | 9/2005 | Delperier et al. | 427/237 |
| 7,182,980 B2 | | 2/2007 | Goujard et al. | |
| 2003/0035893 A1 | * | 2/2003 | Daws et al. | 427/255.28 |

OTHER PUBLICATIONS

W. V. Kotlensky; *Deposition of Pyrolytic Carbon in Porous Solids*; Chemistry and Physics of Carbon, vol. 9, 173, 190-203 (1973).
W. J. Lackey; *Review, Status, and Future of the Chemical Vapor Infiltration Process for Fabrication of Fiber-Reinforced Ceramic Composites*; Ceram. Eng. Sci. Proc. 10[7-8] 577-584 (1989).
S. Kamura, N. Takase, S. Kasuya, & E. Yasuda; *Fracture Behaviour of C Fiber/CVD C Composite*; Carbon '80 (German Ceramic Society) (1980).

(Continued)

*Primary Examiner*—Bret Chen
(74) *Attorney, Agent, or Firm*—Brinks Hofer Gilson & Lione

(57) ABSTRACT

An apparatus and method for densifying porous structures inside a furnace using pressure gradient CVI/CVD. The apparatus includes a stack of porous structures where each porous structure has an aperture therethrough. The apparatus also includes at least one ring-like spacer disposed within the stack of porous structures between neighboring porous structures. The ring-like spacer encircles the apertures of the neighboring porous structures. The stack of porous structures and the at least one ring-like spacer define an enclosed cavity including each porous structure aperture. A channel provides fluid communication between the enclosed cavity and an outer volume defined by the interior surface of the furnace.

19 Claims, 12 Drawing Sheets

OTHER PUBLICATIONS

A. J. Caputo & W. J. Lackey; *Fabrication of Fiber-Reinforced Ceramic Composites by Chemical Vapor Infiltration*; Prepared by the Oak Ridge National Laboratory for the U. S. Department of Energy under Contract No. DE-AD05-840R21400 (1984).

T. Hunh, C. V. Burkland, & B. Bustamante; *Densification of a Thick Disk Preform with Silicon Carbide Matric by a CVI Process*; Ceram. Eng. Proc 12[9-10] pp. 2005-2014 (1991).

T. M. Besmann, R. A. Lowden, D. P. Stinton, & T. L. Starr; *A Method for Rapid Chemical Vapor Infiltration of Ceramic Composites*, Journal De Physique, Colloque C5, supplement au n 5, Tome 50 (1989).

T. D. Gulden, J. L. Kaae, & K. P. Norton; *Forced-Flow Thermal Gradient Chemical Vapor Infiltration (CVI) of Ceramic Matrix Composites*; Proc.-Electrochemical Society (1990), 90-112 (Proc. Int. Conf. Checm. Vap. Deposition, 11th, 1990) 546-552.

\* cited by examiner

PRESSURE GRADIENT CVI/CVD APPARATUS AND METHOD

BACKGROUND

The invention relates to the field of high temperature composites made by the chemical vapor infiltration and deposition of a binding matrix within a porous structure. More particularly, the invention relates to pressure gradient processes for forcing infiltration of a reactant gas into a porous structure, apparatus for carrying out such processes, and the resulting products.

Chemical vapor infiltration and deposition (CVI/CVD) is a well known process for depositing a binding matrix within a porous structure. The term "chemical vapor deposition" (CVD) generally implies deposition of a surface coating, but the term is also used to refer to infiltration and deposition of a matrix within a porous structure. As used herein, the term CVI/CVD is intended to refer to infiltration and deposition of a matrix within a porous structure. The technique is particularly suitable for fabricating high temperature structural composites by depositing a carbonaceous or ceramic matrix within a carbonaceous or ceramic porous structure resulting in very useful structures such as carbon/carbon aircraft brake disks, and ceramic combustor or turbine components. The generally known CVI/CVD processes may be classified into four general categories: isothermal, thermal gradient, pressure gradient, and pulsed flow. See W. V. Kotlensky, *Deposition of Pyrolytic Carbon in Porous Solids*, 8 Chemistry and Physics of Carbon, 173, 190-203 (1973); W. J. Lackey, *Review, Status, and Future of the Chemical Vapor Infiltration Process for Fabrication of Fiber-Reinforced Ceramic Composites*, Ceram. Eng. Sci. Proc. 10[7-8] 577, 577-81 (1989) (W. J. Lackey refers to the pressure gradient process as "isothermal forced flow"). In an isothermal CVI/CVD process, a reactant gas passes around a heated porous structure at absolute pressures as low as a few millitorr. The gas diffuses into the porous structure driven by concentration gradients and cracks to deposit a binding matrix. This process is also known as "conventional" CVI/CVD. The porous structure is heated to a more or less uniform temperature, hence the term "isothermal," but this is actually a misnomer. Some variations in temperature within the porous structure are inevitable due to uneven heating (essentially unavoidable in most furnaces), cooling of some portions due to reactant gas flow, and heating or cooling of other portions due to heat of reaction effects. In essence, "isothermal" means that there is no attempt to induce a thermal gradient that preferentially affects deposition of a binding matrix. This process is well suited for simultaneously densifying large quantities of porous articles and is particularly suited for making carbon/carbon brake disks. With appropriate processing conditions, a matrix with desirable physical properties can be deposited. However, conventional CVI/CVD may require weeks of continual processing in order to achieve a useful density, and the surface tends to densify first resulting in "seal-coating" that prevents further infiltration of reactant gas into inner regions of the porous structure. Thus, this technique generally requires several surface machining operations that interrupt the densification process.

In a thermal gradient CVI/CVD process, a porous structure is heated in a manner that generates steep thermal gradients that induce deposition in a desired portion of the porous structure. The thermal gradients may be induced by heating only one surface of a porous structure, for example by placing a porous structure surface against a susceptor wall, and may be enhanced by cooling an opposing surface, for example by placing the opposing surface of the porous structure against a liquid cooled wall. Deposition of the binding matrix progresses from the hot surface to the cold surface. The fixturing or equipment for a thermal gradient process tends to be complex, expensive, and difficult to implement for densifying relatively large quantities of porous structures.

In a pressure gradient CVI/CVD process, the reactant gas is forced to flow through the porous structure by inducing a pressure gradient from one surface of the porous structure to an opposing surface of the porous structure. Flow rate of the reactant gas is greatly increased relative to the isothermal and thermal gradient processes which results in increased deposition rate of the binding matrix. This process is also known as "forced-flow" CVI/CVD. Prior fixtures for pressure gradient CVI/CVD tend to be complex, expensive, and difficult to implement for densifying large quantities of porous structures. An example of a process that generates a longitudinal pressure gradient along the lengths of a bundle of unidirectional fibers is provided in S. Kamura, N. Takase, S. Kasuya, and E. Yasuda, *Fracture Behaviour of C Fiber/CVD C Composite*, Carbon '80 (German Ceramic Society) (1980). An example of a process that develops a pure radial pressure gradient for densifying an annular porous wall is described in U.S. Pat. Nos. 4,212,906 and 4,134,360. The annular porous wall disclosed by these patents may be formed from a multitude of stacked annular disks (for making brake disks) or as a unitary tubular structure. For thick-walled structural composites, a pure radial pressure gradient process generates a very large, undesirable density gradient from the inside cylindrical surface to the outside cylindrical surface of the annular porous wall. Also, the surface subjected to the high pressure tends to densify very rapidly causing that surface to seal and prevent infiltration of the reactant gas to low density regions. This behavior seriously limits the utility of the pure radial pressure gradient process.

Finally, pulsed flow involves rapidly and cyclically filling and evacuating a chamber containing the heated porous structure with the reactant gas. The cyclical action forces the reactant gas to infiltrate the porous structure and also forces removal of the cracked reactant gas by-products from the porous structure. The equipment to implement such a process is complex, expensive, and difficult to maintain. This process is very difficult to implement for densifying large numbers of porous structures.

Many workers in the art have combined the thermal gradient and pressure gradient processes resulting in a "thermal gradient-forced flow" process. Combining the processes appears to overcome the shortcomings of each of the individual processes and results in very rapid densification of porous structures. However, combining the processes also results in twice the complexity since fixturing and equipment must be provided to induce both thermal and pressure gradients with some degree of control. A process for densifying small disks and tubes according to a thermal gradient-forced flow process is disclosed by U.S. Pat. No. 4,580,524; and by A. J. Caputo and W. J. Lackey, *Fabrication of Fiber-Reinforced Ceramic Composites by Chemical Vapor Infiltration*, Prepared by the OAK RIDGE NATIONAL LABORATORY for the U.S. DEPARTMENT OF ENERGY under Contract No. DE-AD05-840R21400 (1984). According to this process, a fibrous preform is disposed within a water cooled jacket. The top of the preform is heated and a gas is forced to flow through the preform to the heated portion where it cracks and deposits a matrix. A process for depositing a matrix within a tubular porous structure is disclosed by U.S. Pat. No. 4,895,108. According to this process, the outer cylindrical surface of the tubular porous structure is heated and the inner cylindrical surface is cooled by a water jacket. The reactant gas is introduced to the inner cylindrical surface. Similar forced flow-thermal gradient processes for forming various articles are disclosed by T. Hunh, C. V. Burkland, and B. Bustamante, *Densification of a Thick Disk Preform with Silicon Carbide Matrix by a CVI Process*, Ceram. Eng. Sci. Proc 12>9-10! pp. 2005-2014 (1991); T. M. Besmann, R. A. Lowden, D. P. Stinton, and T. L. Starr, *A Method for Rapid Chemical Vapor Infiltration of Ceramic Composites*, Journal De Physique, Colloque C5, supplement au n 5, Tome 50 (1989); T. D. Gulden, J. L. Kaae, and K. P. Norton, *Forced-Flow Thermal-Gradient Chemical Vapor Infiltration (CVI) of Ceramic Matrix Composites*, Proc.-Electrochemical Society (1990), 90-12 (Proc. Int. Conf. Chem. Vap. Deposition, 11th, 1990) 546-52. Each of these disclosures describes processes for densifying only one porous article at a time, which is impractical for simultaneously processing large numbers of composite articles such as carbon/carbon brake disks.

Previous patents have disclosed pressure gradient CVI/CVD processes and apparatus, such as U.S. Pat. No. 5,480,678, entitled "Apparatus for Use with CVI/CVD Processes," and U.S. Pat. No. 5,853,485, entitled "Pressure Gradient CVI/CVD Apparatus Process and Product." U.S. Pat. No. 5,480,678 discloses a fixture for depositing a matrix within a stack of porous structures by a pressure gradient CVI/CVD process. The fixtures are disposed in a CVI/CVD furnace. The fixtures include a stack of disk-shaped porous structures separated by ring-like spacers, with the stack of porous structures defining an enclosed cavity. The inside of the furnace defines a reactor volume, which is separate from the enclosed cavity. A reactant gas is supplied to the enclosed cavity and a pressure difference is flows from the enclosed cavity, through the porous structure, and into the reactor volume. The ring-like spacers seal adjacent porous structures which prevents gas from leaking from the enclosed cavity into the reactor volume without passing through a porous structure.

U.S. Pat. No. 5,853,485 discloses an apparatus and method for depositing a matrix within a stack of porous structures by a pressure gradient CVI/CVD process. The apparatus includes a furnace with a gas inlet for introducing a reactant gas and a fixture like that described U.S. Pat. No. 5,480,678. The reactant gas comprises a mixture of two reactant gases that are introduced through a first main gas line and a second main gas line. The reactant gas infiltrates the porous structures where it cracks and deposits a matrix. The method includes depositing a first carbon matrix within the porous structures by a pressure gradient CVI/CVD process. The porous structures are then subjected to a heat treatment process without removing the porous structures from the furnace or from the fixtures. Following heat treatment, the porous structures are removed from the furnace and surface machined. A second carbon matrix is then deposited within the porous structures by a conventional CVI/CVD process. After reaching final density, the densified structures are machined into final parts. Other methods are also presented, each of which require intermediate machining and at least two CVI/CVD steps.

Thus, previous processes frequently required multiple densification steps, with the porous structures requiring rearrangement and machining between steps in order to achieve acceptable densification results in the final product. The rearrangement and machining between cycles is costly and time-consuming. Thus, in spite of these advances, a CVI/CVD process and an apparatus for implementing that process are desired that rapidly and uniformly densifies porous structures while minimizing cost and complexity. Such a process would preferably be capable of simultaneously densifying large numbers (as many as hundreds) of individual porous structures in a single step. In particular, a process is desired for rapidly and economically densifying large numbers of annular fibrous preform structures for aircraft brake disks having desirable physical properties.

BRIEF SUMMARY

The present invention is directed to an apparatus for densifying porous structures inside a furnace using pressure gradient CVI/CVD. The apparatus includes a stack of porous structures where each porous structure has an aperture therethrough. The apparatus also includes at least one ring-like spacer disposed within the stack of porous structures between neighboring porous structures. The ring-like spacer encircles the apertures of the neighboring porous structures. The stack of porous structures and the at least one ring-like spacer define an enclosed cavity including each porous structure aperture. The apparatus includes a channel providing fluid communication between the enclosed cavity and an outer volume defined by the interior surface of the furnace.

The present invention is also directed to a process for pressure gradient CVI/CVD densifying porous structures inside a furnace. The process includes providing a furnace, the furnace defining an outer volume, and assembling a multitude of porous structures and ring-like spacers in a stack with a ring-like spacer between each adjacent pair of porous structures. The process also includes disposing the stack of porous structures between a bottom plate and a top plate. The bottom plate, the stack of porous structures, and the at least one ring-like spacer define an enclosed cavity extending from the bottom plate, including each porous structure aperture, and terminating proximate the top plate. The process also includes providing a fluid communication means between the enclosed cavity and the outer volume. The process also includes allowing gas to flow through the fluid communication means while maintaining a pressure gradient between the enclosed cavity and the outer volume and densifying the porous structures.

The present invention allows pressure gradient CVI/CVD densification in a single cycle. This has the benefits of an increase in efficiency from the elimination of the numerous non-value added steps, such as production queue times, furnace loading and unloading, and furnace heat-up and cool-down. In-process machining is also reduced in the single cycle process.

The foregoing paragraphs have been provided by way of general introduction, and are not intended to limit the scope of the following claims. The presently preferred embodiments, together with further advantages, will be best understood by reference to the following detailed description taken in conjunction with the accompanying drawings.

DETAILED DESCRIPTION OF THE DRAWINGS AND THE PRESENTLY PREFERRED EMBODIMENTS

The invention and various embodiments thereof are presented in FIGS. 1 through 13 and the accompanying descriptions wherein like numbered items are identical. As used herein, the term "conventional CVI/CVD" is intended to refer to the previously described isothermal CVI/CVD process. The term "pressure gradient CVI/CVD" is intended to refer to the previously described pressure gradient CVI/CVD or forced-flow process and is intended to specifically exclude the previously described thermal gradient and thermal gradient-forced flow processes to the extent that these processes utilize an intentionally induced thermal gradient that affects the deposition process. The term "single cycle" refers to a process that is capable of densifying preforms from a starting density to a desired product density in one pressure gradient CVI/CVD process cycle without the need for machining or rearranging the preforms during the pressure gradient CVI/CVD process.

Figure 1:
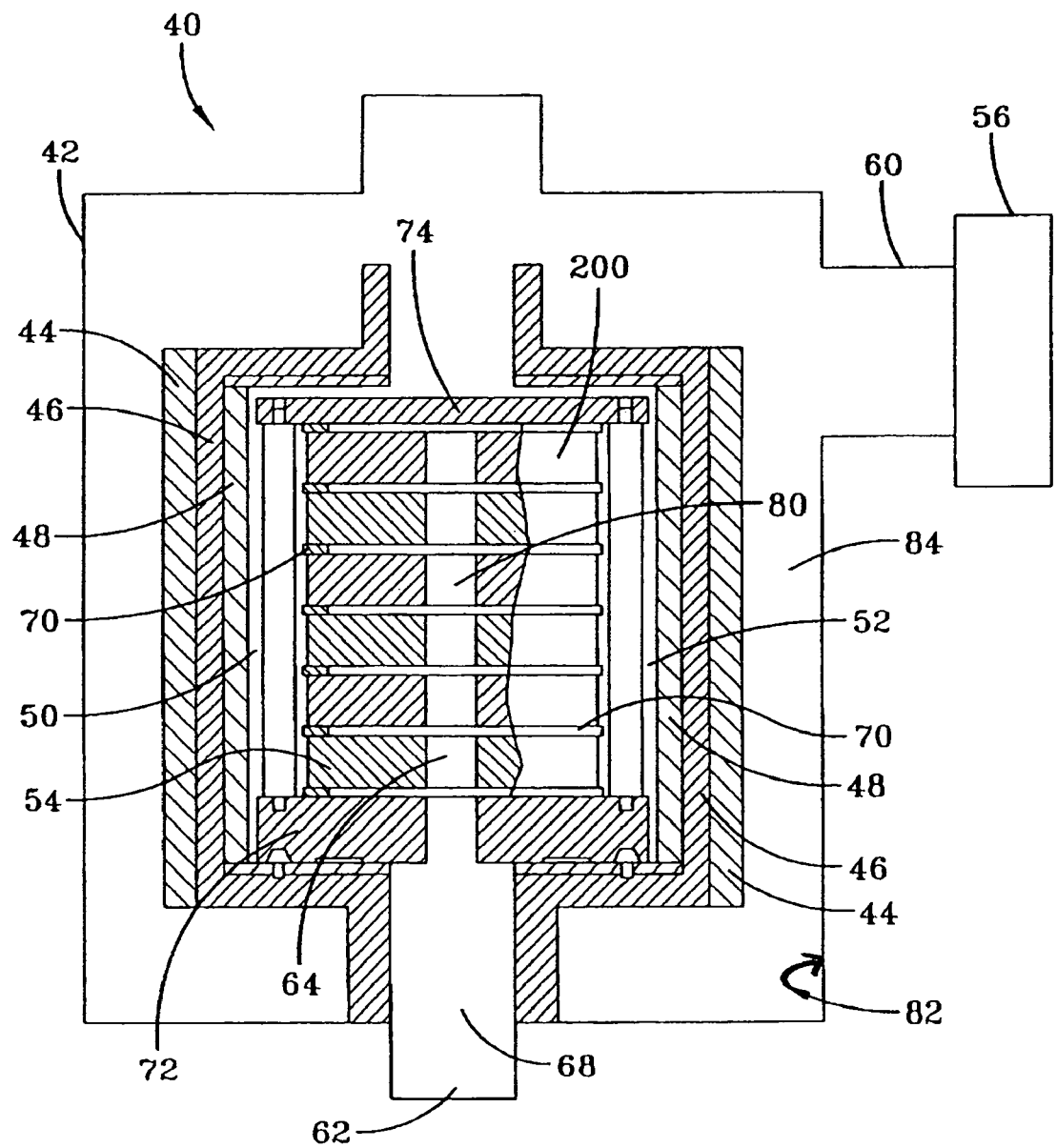
FIG. 1 shows a sectional view of a CVI/CVD furnace.

Referring now to FIG. 1, a schematic depiction is presented of a CVI/CVD furnace 40 adapted to deposit a matrix within a porous structure 54 by a pressure gradient CVI/CVD process according to an aspect of the invention. The furnace 40 has a shell 42 with an inner surface 82 that defines a furnace volume 84, and a gas inlet 62 for introducing a gas into the furnace 40. A susceptor 48 is disposed around the reactor volume 50 and is induction heated by an induction coil 44 according to methods well known in the art. Although a susceptor is described herein, other methods of heating may also be used, such as resistance heating and microwave heating, any of which are considered to fall within the purview of the invention. An insulation barrier 46 is disposed between the susceptor 48 and the induction coil 44. The susceptor 48 has an inner surface 52 that defines a reactor volume 50 which is included within the furnace volume 84. The porous structures 54 are disposed within a fixture 200 in the reactor volume 50. A vacuum apparatus 56 comprising a vacuum pump or steam vacuum system is in fluid communication with an exhaust 60 and evacuates the furnace volume 84 to a pressure below atmospheric pressure. A reactant gas is introduced into the enclosed cavity or inner volume 80 through the gas inlet 62 that receives the reactant gas. The reactant gas infiltrates the porous structure 54 where it cracks and deposits a matrix within the porous structure 54. A single type of gas or mixtures of multiple types of gases may be supplied to the gas inlet 62. The gas used for carbon CVI is typically composed of hydrocarbons, such as those found in natural gas, e.g. methane, ethane, propane, and butane. The gas may also be one of the several precursors used for ceramic CVI, such as methyltrichlorosilane.

The porous structures 54 include porous structure apertures 64. A tube 68 is in fluid communication with inner volume 80 and the inlet 62 thereby serving to transfer the reactant gas to inner volume 80. The porous structures 54 are sealed between the plates by ring-like spacers 70. The ring-like spacers 70 are generally disk shaped with flat top and bottom surfaces. The furnace volume 84 and reactor volume 50 are reduced to a pressure below atmospheric pressure, and the gas is introduced to the porous structure aperture 64 at a greater pressure than the reactor volume pressure which develops a pressure gradient through the wall of the porous structure 54 and forces dispersion of the gas through the wall of the porous structure 54 before being withdrawn from the reactor volume 50 and the furnace volume 84 by the vacuum apparatus 56.

Figure 2:
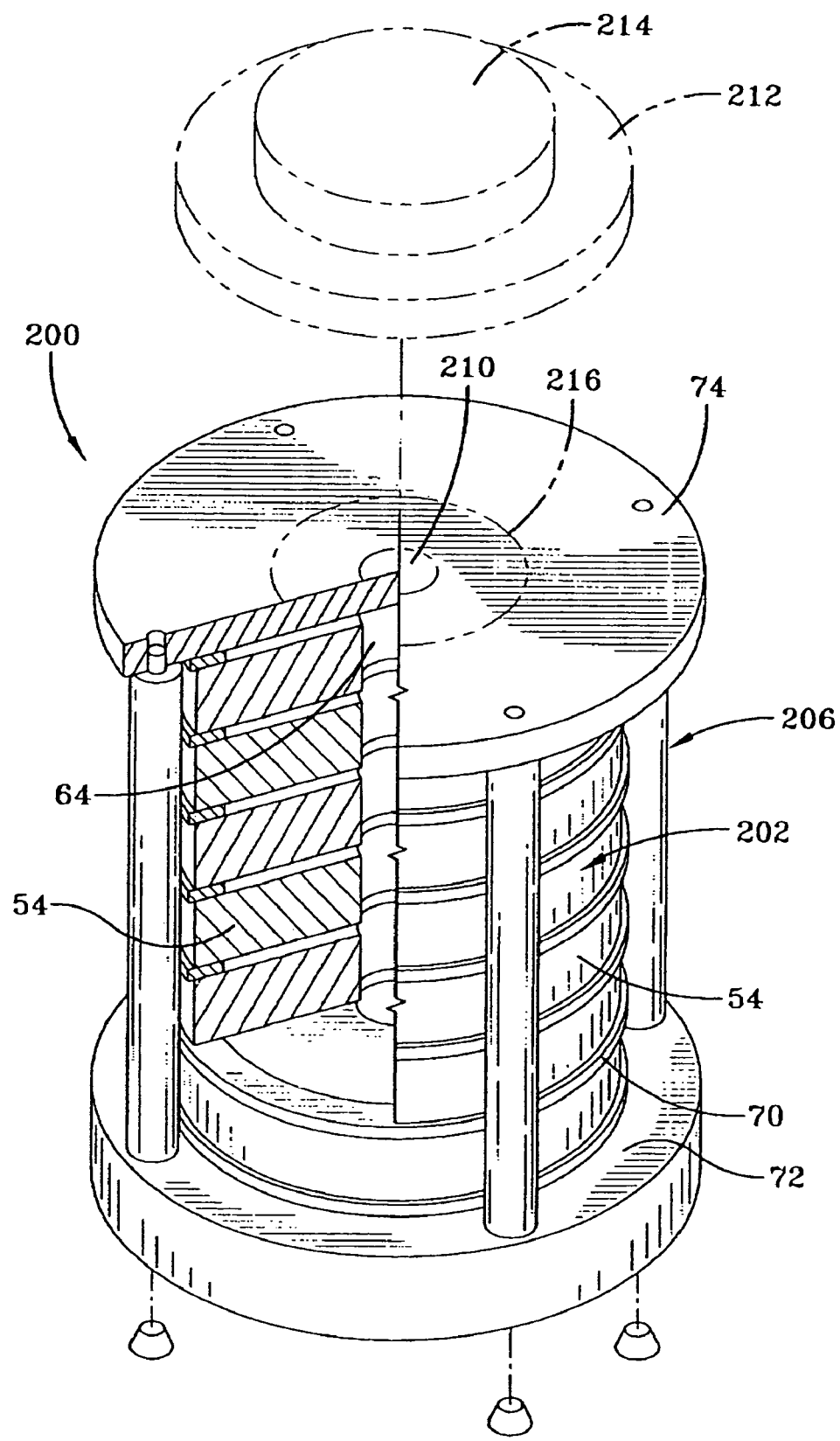
FIG. 2 shows a perspective view of a fixture with a stack of porous structures.

A fixture 200 with the porous structures 54 to be pressure gradient CVI/CVD densified inside a furnace is presented in FIG. 2. The porous structures 54 are arranged in a stack 202. The fixture comprises a base plate 72, a spacing structure 206, and a top plate 74. The top plate 74 optionally has an aperture 210 which is sealed by a cover plate 212 and weight 214. With this option, a cover plate seal 216 is preferably disposed between the cover plate 212 and the top plate 74 and encircles the top plate aperture 210. Each porous structure 54 has an aperture 64. The fixture 200 with the porous structures 54 may be disposed within the reactor volume 50 of CVI/CVD furnace 40 (FIG. 1).

The furnace 40 and fixture 200 are described in more detail in U.S. Pat. No. 5,480,678, entitled "Apparatus for Use with CVI/CVD Processes," and U.S. Pat. No. 5,853,485, entitled "Pressure Gradient CVI/CVD Apparatus Process and Product," the entire contents of which are herein incorporated by reference. In particular, U.S. Pat. No. 5,480,678 discloses a furnace which is induction heated and includes a susceptor disposed within the furnace. Induction coils encircle the susceptor wall. An insulation barrier is disposed between the susceptor wall and the coils. The porous structures are disposed within the reactor volume and are predominantly heated by radiation from the susceptor. A preheater raises the temperature of the reactant gas before it enters the hot zone of the furnace, to a value typically 50 to 100° F. below the desired process temperature of the porous structures. U.S. Pat. No. 5,480,678 also discloses the process of assembling the fixture with the stack of porous structures. The stack of porous structures is placed in compression between a top plate and a base plate by forcing the opposing plates a distance toward each other that reduces the stack height by compression. The compression of the stack causes the enclosed cavity to become sealed by virtue of the ring-like spacers sealing adjacent porous structures to prevent gas from leaking from the enclosed cavity into the reactor volume. A weight may be placed upon the top plate.

U.S. Pat. No. 5,853,485 discloses a pressure gradient CVI/CVD furnace. Control valves control the flow of reactant gas into the furnace. The reactant gas comprises a mixture of two reactant gases that are introduced through a two gas lines, each of which has a flow meter. Pressure inside the furnace volume and inside the porous structure is measured by pressure sensors. Temperature sensors measure the temperature inside the porous structure aperture and the temperature of the porous structure. The temperature and pressure conditions are chosen to cause the gas to crack and deposit a matrix having certain desired properties within the porous structure.

The various aspects of the present invention may be used to deposit any type of CVI/CVD matrix including, but not limited to, carbon or ceramic matrix deposited within carbon or ceramic based porous structures 54. The invention is particularly useful for depositing a carbon matrix within a carbon-based porous structure, and especially for making carbon/carbon composite structures such as aircraft brake disks. The furnace 40 may be suited for simultaneously densifying large quantities of porous articles, for example five hundred to one thousand annular preforms for manufacturing aircraft brake discs.

A unique feature of the present invention is that in addition to the reactant gas introduced into enclosed cavity 80, a portion of reactant gas is introduced into the reactor volume 50. This process allows for products with a desirable densified structure produced in a single CVI/CVD process cycle. The reactant gas may be introduced into the reactor volume 50 by a variety of methods, as described below. All of these methods of introducing reactant gas into the reactor volume 50, and variations thereof, are intended to be encompassed within the scope of the present invention.

Figure 4:
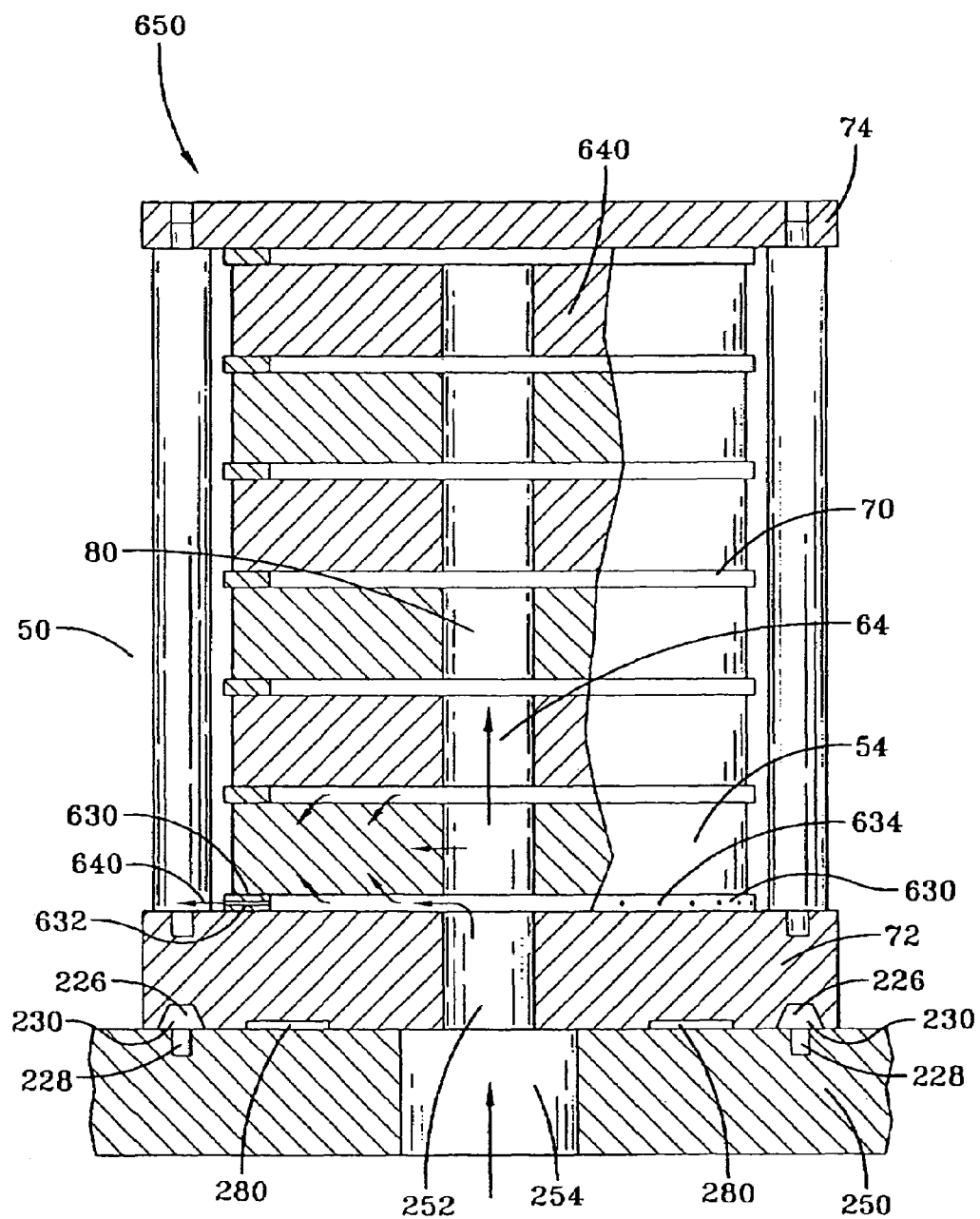
FIG. 4 shows a sectional view of a fixture with a stack of porous structures with a pass-through spacer.

Referring now to FIG. 4, a sectional view of a fixture 200 is presented. The base plate or bottom plate 72 is adapted to be secured inside the CVI/CVD furnace 40 (FIG. 1) to the furnace floor plate 250. Still referring to FIG. 4, the base plate 72 has a base plate aperture 252 in fluid communication with furnace floor aperture 254. The base plate is preferably located by a plurality of conical pins 226 disposed in mating conical pin holes 228 in furnace floor plate 250. The base plate 72 has mating conical base plate holes 230 that are aligned with and receive the conical pins 226. This arrangement facilitates aligning the base plate aperture 252 with the furnace floor aperture 254. The base plate 72 is preferably sealed to the furnace floor plate 250, and a compliant gasket 280 may be disposed between the base plate 72 and the furnace floor plate 250 for this purpose. Suitable compliant gaskets may be formed from a flexible graphite such as Grafoil® from UCAR Carbon Company Inc., Cleveland, Ohio, U.S.A. or EGC Thermafoil® brand flexible graphite sheet and ribbon-pack available from EGC Enterprises Incorporated, Mentor, Ohio, U.S.A.

Figure 3:
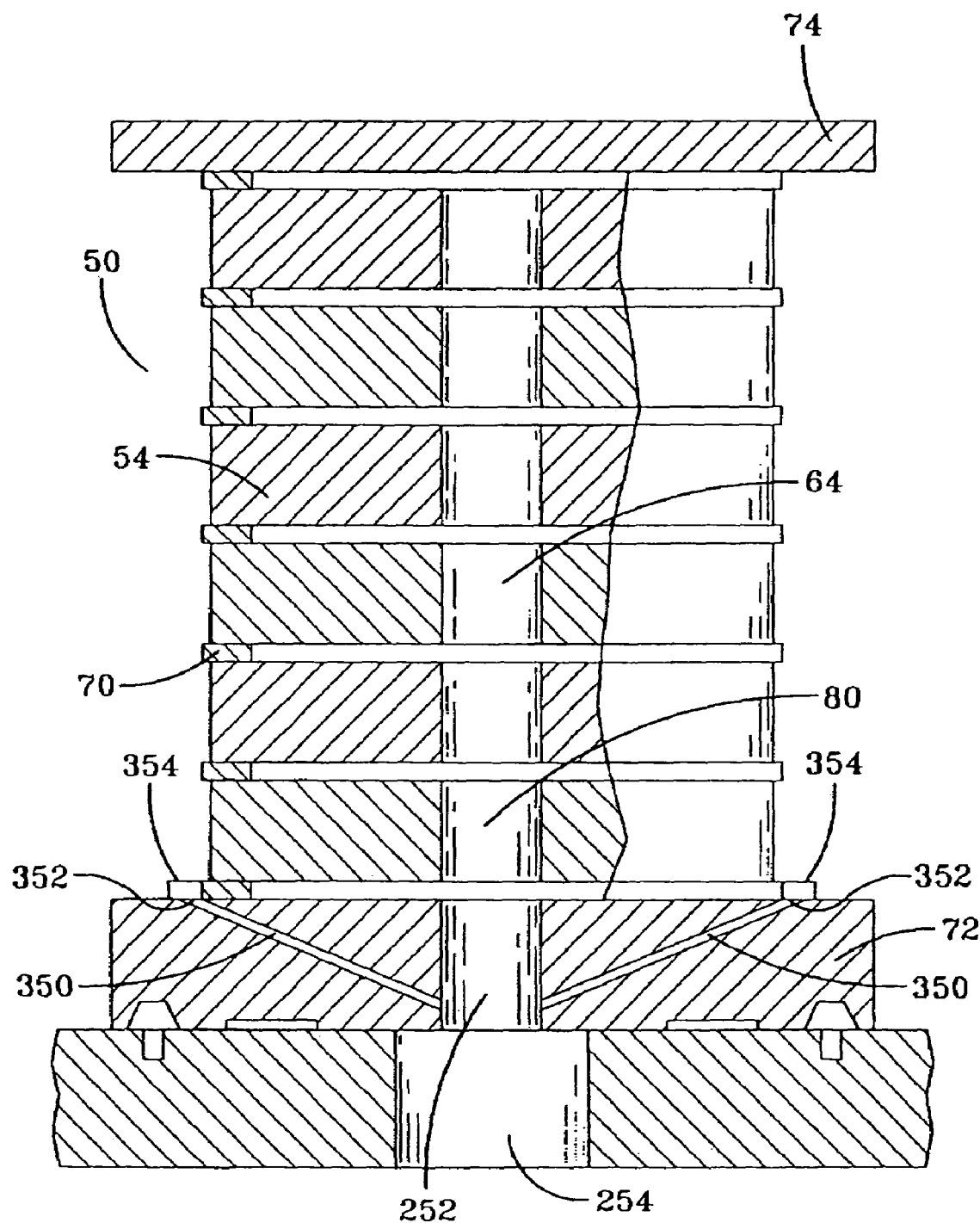
FIG. 3 shows a sectional view of a fixture with a stack of porous structures and bottom pressure release.

FIG. 3 shows an alternative stack configuration. In this configuration, the base plate 72 includes channels 350 that allow fluid communication between the base plate aperture 252 and the reactor volume 50. During the course of a run, the gas pressure in inner volume 80 is generally greater than or equal to the gas pressure in reactor volume 50. A pressure regulation device 354 at the channel outlet 352 controls the flow of gas from the base plate aperture 252 in the inner volume 80 to the reactor volume 50. In one embodiment, the pressure regulation device 354 regulates gas flow from the inner volume 80 through the channels 350 into the reactor volume 50. In one embodiment, the pressure regulation devices 354 allow gas to flow through the channels 350 only after the gas pressure in inner volume 80 reaches a certain predetermined pressure differential. The flow of gas through channels 350 is generally less than 10% of the total reactant gas flowing into the inner volume 80. In one embodiment, a pair of channels 350 of 0.25 inches (0.635 cm) in diameter are drilled through the bottom base plate 72, from the base plate aperture 252 to the reactor volume 50 outside of the stack. A small graphite disk lined with Grafoil® is positioned over each of the channel outlets 352. Guide pins encircle each hole to keep the graphite disk centered over each hole. Thus, when a certain stack pressure differential is reached between inner volume 80 and reactor volume 50, gas is vented from the base plate aperture 252 to the reactor volume 50. In an alternative embodiment, the pressure regulation devices 354 are not used and gas is allowed to flow through channels 350 during the course of the entire run.

In the embodiment depicted in FIG. 3, the spacers 70 do not include channels or holes for fluid communication between the porous structure aperture 64 and the reactor volume 50. However, the spacers 70 may be replaced with alternative spacer designs 600 and 700, as shown in FIGS. 6 and 7 and described below. Additionally, the number of channels 350 may be varied to control the amount of gas flow from the base plate aperture 252 to the reactor volume 50, in order to optimize the densification of the porous structures. The size of some or all of the channels 350 could also be increased.

Figure 6A:
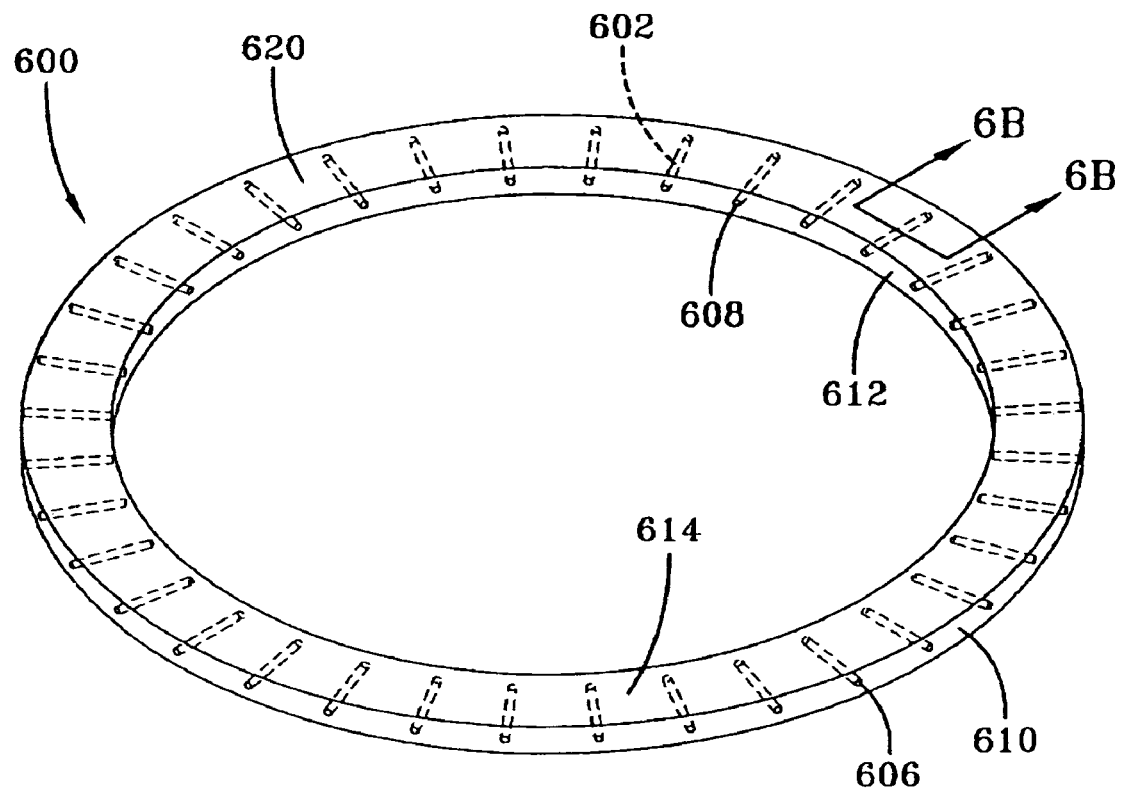
FIG. 6A shows a perspective view of a pass-through spacer with channels.
Figure 6B:
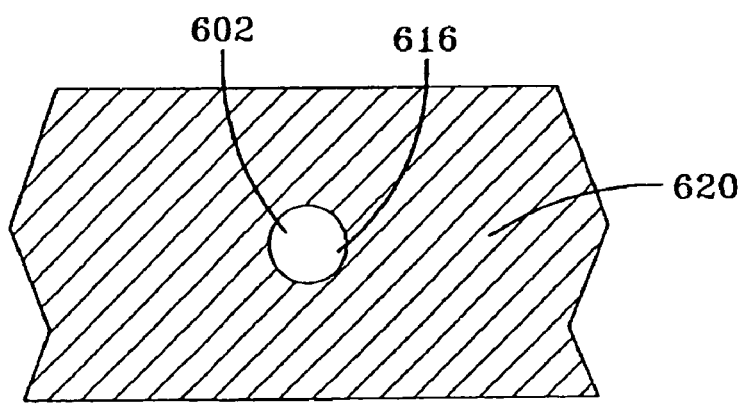
FIG. 6B shows a sectional view of a pass-through spacer with channels.

FIG. 6 shows a pass-through spacer design 600 of the present invention. The spacer is disk shaped, with a flat top surface 614 and flat bottom surface. The spacer 600 has an outer surface 610 and an inner surface 612. Running through the body 614 of the spacer are a series of channels 602. The channels 602 connect holes 606 in the outer surface 610 and holes 608 in the inner surface 612, allowing fluid communication between the areas adjacent the outer holes 606 and the inner holes 608. In one embodiment, the spacer includes 36 channels arranged every 10° around the spacer. However, it will be apparent to those skilled the art that other hole arrangements are possible. FIG. 6B shows a cross sectional view along line 6B-6B of FIG. 6. The channel 602 is positioned in the spacer body 620 and has a cross-sectional area 616. The channels 602 are shown as circular channels, but it will be apparent to those skilled in the art that other channel geometries are possible. The pass-through spacer may be manufactured by drilling a series of holes through a spacer of appropriate and desired dimensions. The purpose of pass-through spacer 600 is to allow a portion of the unreacted gas to pass from the inner volume to the reactor volume. This allows densification of the outer diameter section of the porous structure, which overall allows densification of the porous structures in a single cycle.

Figure 7A:
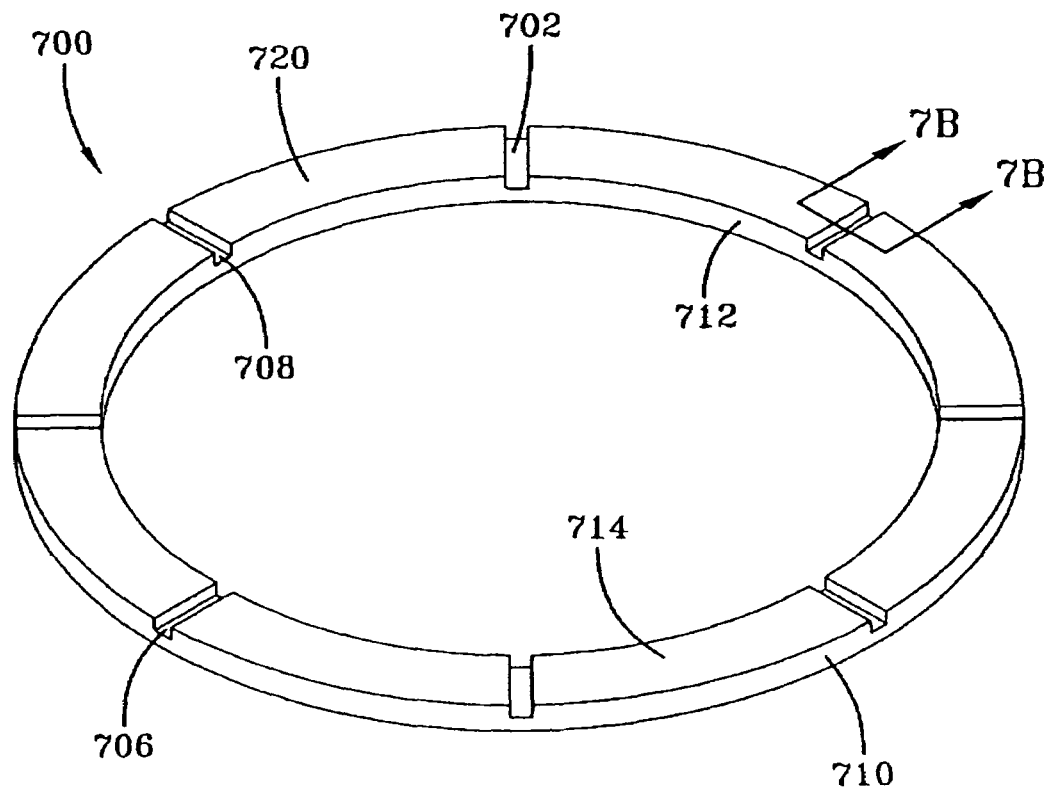
FIG. 7A shows a perspective view of a pass-through spacer with slots.
Figure 7B:
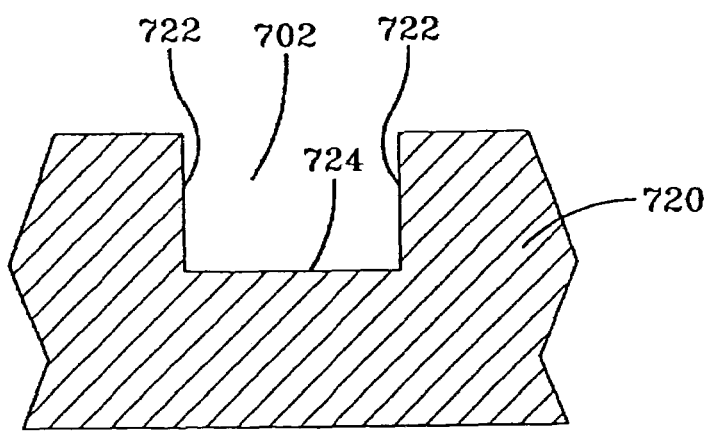
FIG. 7B shows a sectional view of a pass-through spacer with slots.

FIG. 7 shows an alternative pass-through spacer design 700 of the present invention. The spacer is disk shaped, with a flat top surface 714 and flat bottom surface. The spacer 700 has an outer surface 710 and an inner surface 712. The top surface 714 has a series of slots 702 positioned in the spacer body 714. FIG. 7B shows a cross sectional view along line 7B-7B of FIG. 7. The slots 702 have a bottom 724 and two sides 722. The slots 702 connect the outer surface 710 and the inner surface 712, allowing fluid communication between the areas adjacent the outer slot end 706 and the inner slot end 708. In one embodiment, the spacer includes eight slots 702 arranged equidistantly around the spacer. However, it will be apparent to those skilled the art that other hole arrangements are possible. The slots 702 are shown as rectangular in cross section, but the geometry of the slots themselves is not believed to be important. It will be apparent to those skilled in the art that other geometries are possible, such as channels with round, oval, or triangular cross-sections.

According to a certain embodiment, the outside diameter of the spacers 600 and 700 is about 21.9 inches and the spacer inside diameter is about 19.9 inches for processing annular porous structures 54 having an outside diameter of about 21 inches. The ring-like spacers are preferably at least 0.25 inch thick. In one embodiment, the spacers are made from graphite or carbon/carbon material. They have been previously coated to prevent CVD bonding to the annular porous structures, allowing for multiple re-use. In one embodiment, the pass-through spacer design 600 depicted in FIG. 6A had 36 equally spaced 0.125 inch diameter radial channels. Each ring has a total open area (i.e. area available for gas flow) of 0.44 in$^2$. In another embodiment, the pass-through spacer design 700 depicted in FIG. 7A includes a 0.10-inch deep×0.125-inch wide slot every 45° around the entire ring, for a total of eight slots per ring. Each ring has a total open area of 0.10 in$^2$. However, other possible holes sizes and number of channels or slots are possible, and may be varied depending on the stack configuration and process operating conditions.

Turning to FIG. 2, if the porous structures 54 are compliant, the neighboring porous structures may be pressed against the spacer 70 which slightly deforms the porous structure and develops a seal. The porous structures are preforms composed of carbon fibers. These preforms generally have an initial bulk density of about 0.40 to 0.50 g/cm$^3$ and about 20-30% fiber volume. Pressing the adjacent porous structures 54 against the ring-like spacer 70 seals each porous structure 54 against the ring-like spacer 70 which prevents the gas from leaking into the reactor volume without passing through the porous structure 54. According to a preferred embodiment, the ring-like spacer is machined from graphite or a graphite-like material with the ring-like spacer sides. This eliminates the need for gaskets between the spacer and the porous structures and greatly simplifies stack assembly. If the porous structures are not compliant (already partially densified for example), merely pressing the porous structures 54 against the ring-like spacer 70 does not produce a sufficient seal. Therefore, in an alternative embodiment, at least one ring-like compliant gasket is disposed adjacent each spacer side, and each compliant gasket is pressed against the neighboring porous structure, which deforms the compliant gaskets against the ring-like spacer to form a seal.

FIG. 4 depicts a fixture 650 with stack configuration 640. Stack configuration 640 includes a pass-through spacer 630 positioned between the base plate 72 and a porous structure 54. Standard spacers 70 are positioned between the other porous structures 54. The pass-through spacer 630 is of the design 600 depicted in FIG. 6. The pass-through spacer 630 includes a plurality of holes 634. Each hole 634 includes a channel 632 which provides fluid communication between the inner volume 80 and the outer volume 50. Gas flows from the base plate aperture 252, through channel 632, and into reactor volume 50, as shown by arrows 640. In normal operation, the gas flow will not be so large as to eliminate the pressure gradient between inner volume 80 and reactor volume 50. Although the embodiment shown FIG. 4 only includes one pass-through spacer 630, it will be apparent to those skilled in the art that other configurations are possible, including positioning the pass though spacer 630 at other locations along the stack height and providing more than one pass-through spacer 630. The pass-through spacer configuration of FIG. 4 could also be combined with the bottom pressure release configuration of FIG. 3. Additionally, pass-through spacers of design 700 could be combined with the configuration shown in FIG. 4.

Figure 5:
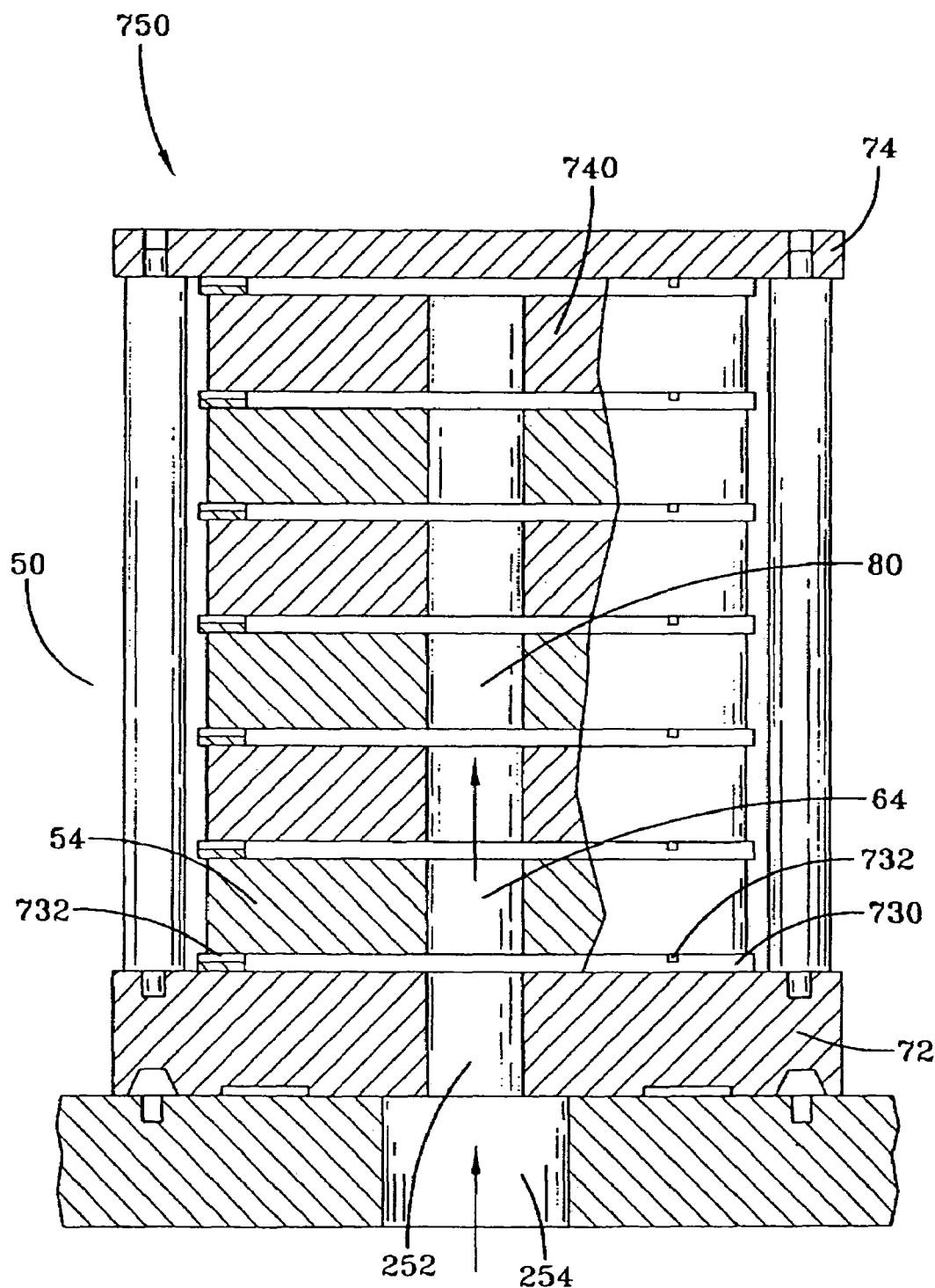
FIG. 5 shows a sectional view of a fixture with a stack of porous structures with pass-through spacers.

FIG. 5 depicts fixture 750 with stack configuration 740. The stack 740 includes pass-through spacers 730 positioned between the base plate 72 and a porous structure 54, and between porous structures 54. The pass-through spacer is of the design 700 depicted in FIG. 7. The pass-through spacer 730 includes a plurality of slots 732. The slots 732 provide fluid communication between the inner volume 80 and the outer volume 50. Gas flows from the inner volume 80, through slot 732, and into reactor volume 50. In normal operation, the gas flow will not be so great as to eliminate the pressure gradient between inner volume 80 and reactor volume 50. Although the embodiment shown FIG. 5 includes pass-through spacers 730 between all adjacent porous structures 54, it will be apparent to those skilled in the art that other configurations are possible, including positioning the pass-though spacer 730 at only some locations along the stack height and providing standard spacers 70 at the other positions. The pass-through spacer configuration of FIG. 5 could be used at some or all positions between porous structures along the stack in combination with the bottom pressure release configuration of FIG. 3. In one embodiment, the slots 732 in the spacers 730 in the bottom half of the stack 740 have a larger cross-sectional area than the spacers 730 in the top half of the stack. This configuration allows for a greater flow rate of gas to pass from the inner volume 80 to the reactor volume 50 in the bottom half of the stack, than the flow rate of gas from the inner volume 80 to the reactor volume 50 in the top half of the stack.

Figure 8:
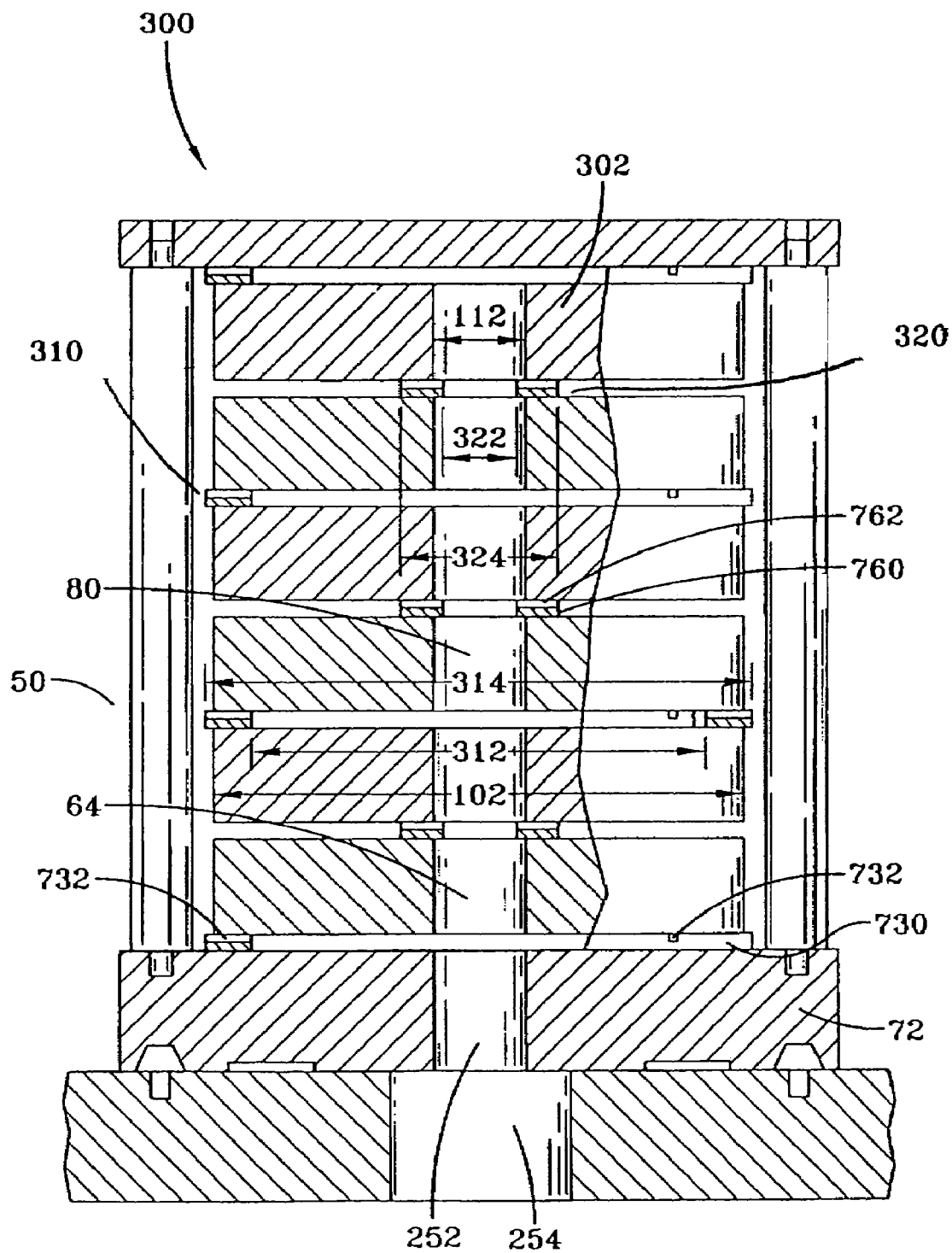
FIG. 8 shows a sectional view of a fixture with a stack of porous structures with alternating ID/OD pass-through spacers.

Referring to FIG. 8, an alternative fixture 300 for pressure gradient densifying a stack of porous structures 302 is presented. Fixture 300 is similar to fixture 750, except stack 302 comprises "OD" (outside diameter) ring-like spacers 310 disposed around the outside diameter of each porous structure 54 alternated with "ID" (inside diameter) ring-like spacers 320 disposed around the inside diameter of each porous structure. The OD spacers 310 are pass-through spacers 730 of the design 700 depicted in FIG. 7. The ID spacers 320 are pass-through spacers 760 of the design 700 depicted in FIG. 7, but with a smaller diameter than spacers 730. The OD pass-through spacer 730 includes a plurality of slots 732. The ID pass-through spacer 760 includes a plurality of slots 762. The slots 732 and 762 provide fluid communication between the inner volume 80 and the outer volume 50. Gas flows from the inner volume 80, through slots 732 and 762, and into reactor volume 50. In normal operation, the gas flow will not be so great as to eliminate the pressure gradient between inner volume 80 and reactor volume 50.

The OD spacers 310 preferably have an inside diameter 312 slightly less than the porous structure outside diameter 102, and an outside diameter 314 that is slightly larger than the porous structure outside diameter 102. The ID spacers 320 preferably have an outside diameter 324 slightly greater than the porous structure inside diameter 112, and an inside diameter 322 that is slightly smaller than the porous structure inside diameter 112. The slight overhang of the spacer around the circumference of the porous structure allows the spacers to be easily removed after the porous structures are densified. The wall thickness (i.e., the difference between the inside and outside diameters) of each spacer 310 and 320 is preferably minimized in order to maximize exposure of the porous structure surface area to the reactant gas as it enters or leaves each porous structure 54.

In the embodiment shown in FIG. 8, all of the OD spacers 310 are of the pass-through design 730 and all of the ID spacers 320 are of the pass-through design 760. However, other spacer designs are possible. Some of the spacers 310 and 320 could be of the normal spacer design 70, or of the alternative pass-through spacer design 600. Other possible spacer configurations will be apparent to those skilled in the art and are intended to be encompassed within the scope of the present invention.

Figure 9:
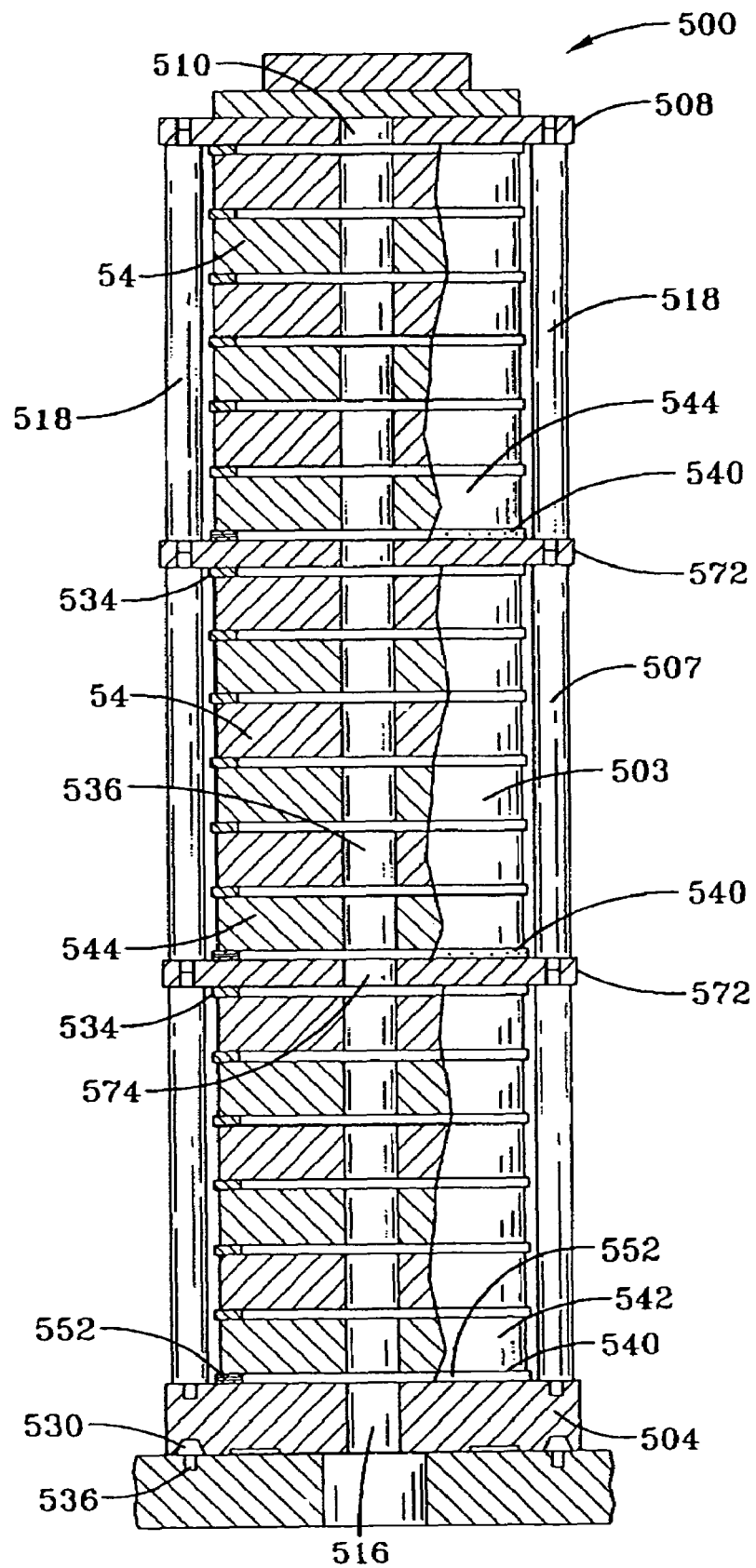
FIG. 9 shows a sectional view of a fixture with a stack of porous structures.

Referring to FIG. 9, a preferred fixture 500 is presented for pressure gradient CVI/CVD densifying simultaneously a large number of porous structures 54. The spacing structure 507 comprises at least one intermediate plate 572 disposed between the base plate 504 and the top plate 508 that divides the stack of porous structures 503. The posts 518 extend between the top plate 508 and one of the intermediate plates 572, between the base plate 504 and another of the intermediate plates 572, and between adjacent pairs of intermediate plates 572. In other respects, fixture 500 is essentially identical to fixture 650. The stack configuration includes pass-through spacers 540 positioned between the base plate 504 and a porous structure 542, and between the intermediate plates 572 and the porous structures 544 above the intermediate plates 572. Standard spacers 70 are positioned between the other porous structures 54. The pass-through spacer 540 is of the design 600 depicted in FIG. 6, which includes a plurality of holes 552.

Still referring to FIG. 9, each intermediate plate 572 has an intermediate plate aperture 574 therethrough. The enclosed cavity 536 further includes each intermediate plate aperture 574. At least one of the ring-like spacers 534 is disposed on either side of and sealed to the intermediate plate 572 between the intermediate plate 572 and the porous structures 54. Multiple fixtures 500 may be stacked. In such case, the base plate 504 from one fixture 500 engages the top plate 508 of a lower fixture 500 with the upper fixture base plate aperture 516 in fluid communication with the lower fixture top plate aperture 510. Thus, the enclosed cavity extends from one fixture 500 to the next until being terminated by the cover plate 512 disposed over the uppermost top plate aperture 510.

Although the embodiment shown FIG. 9 includes pass-through spacers 540 only above the base plate 504 and the intermediate plates 572, it will be apparent to those skilled in the art that other configurations are possible, including positioning pass though spacer 540 at other locations along the stack height. The pass-through spacers 540 could also be replaced with a spacer of the alternative design 700.

Figure 10:
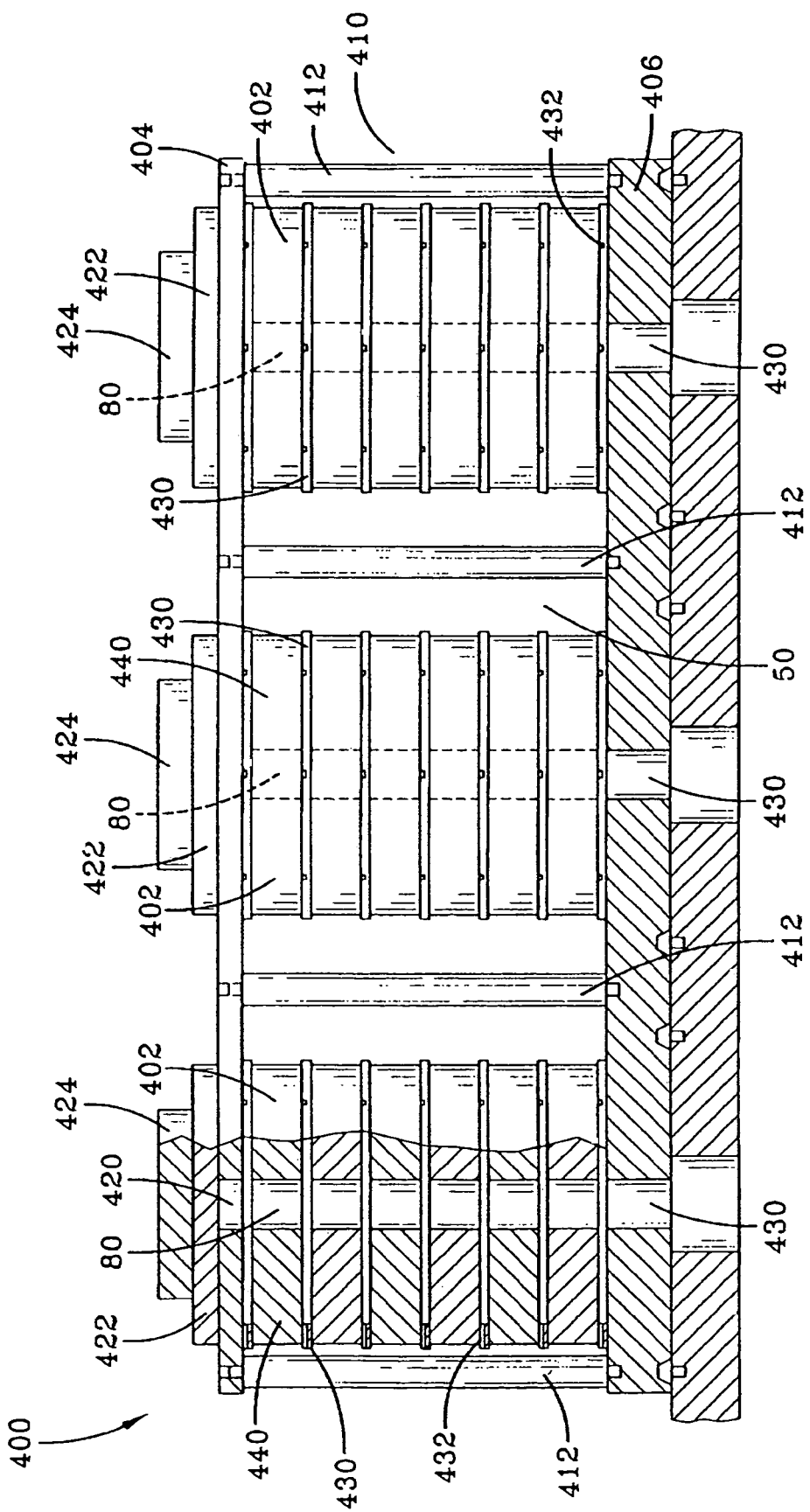
FIG. 10 shows a sectional view of a fixture with multiple stacks of porous structures.

FIG. 10 presents a fixture 400 whereby first and second or more stacks of porous structures may be disposed laterally adjacent each other. A plurality of adjacent stacks 402 of porous structures 440 are disposed between a top plate 404 and a base plate 406 along with a spacing structure 410. A spacing structure 410 comprises a multitude of posts 412. A top plate 404 optionally has a top plate aperture 420 for each stack 402 that may be sealed by cover plates 422 and weights 424. A base plate has a base plate aperture 430 for each stack 402. In other respects, fixture 400 is similar to fixture 750. The stacks 402 include pass-through spacers 430 positioned between the base plate 406 and porous structures 440, and between adjacent porous structures 440. The pass-through spacer is of the design 700 depicted in FIG. 7. The pass-through spacer 430 includes a plurality of slots 432. The slots 432 provide fluid communication between the inner volumes 80 and the outer volume 50.

Although the embodiment shown FIG. 10 includes pass-through spacers 430 between all adjacent porous structures 440, other configurations are possible, including positioning the pass-though spacer 430 at only some locations along the stack height and providing standard spacers 70 at the other positions. The pass-through spacer configuration of FIG. 10 could also be combined with the bottom pressure release configuration of FIG. 3. These other combinations are intended to be encompassed within the scope of the present invention.

In addition, spacing structure 410 may comprise intermediate plates that divide the stacks 402, and multiple fixtures 400 may be stacked one on top of another as described in relation to fixture 500 of FIG. 9. Thus, the features of fixtures 400 and 500 may thus be combined as necessary to enable pressure gradient densification of a very large number of porous structures 54.

The details of the process of the present invention, where not described herein, are substantially similar to the pressure gradient CVI/CVD densifying porous structures as described in detail in U.S. Pat. Nos. 5,480,678 and 5,853,485. According to a preferred embodiment, a multitude of annular porous carbon structures are disposed within a CVI/CVD furnace such as furnace 40 (FIG. 1) using multiple fixtures such as fixture 500 (FIG. 9) or fixture 400 (FIG. 10). The enclosed cavity of each fixture may be partially sealed by the ring-like spacers 70 sealing adjacent porous structures to prevent gas from leaking from the inner volume into the reactor volume. However, pass through spacers of design 600 or 700 may be placed at a plurality of locations between porous structures to allow controlled flow of reactant gas from the inner volume 80 to the outer volume 50. The type, number, and location of the pass-through spacers are chosen in order to optimize the densification of the porous structures to the desired product properties. A plurality of control valves and flow meters is used to control the flow of reactant gas to the furnace. The reactants gas flows though one or more preheaters, which raise the temperature of the reactant gas. A susceptor, such as susceptor 48 in FIG. 1, heats the porous structures. Reactant gas is then supplied to the inner volumes of each fixture. A small amount of reactant gas is introduced into the outer volume 50. This reactant gas may be introduced into the outer volume through channels 350 in the base plate (FIG. 3), through the channels in pass-through spacer designs 600 and 700, through other means, or through some combination of the above. Temperature sensors measure the temperatures inside the porous structure apertures and the temperatures of the porous structures. The temperature and pressure conditions are chosen to cause the gas to crack and deposit a matrix having certain desired properties within the porous structure. The pressure difference between the gas in the inner volume and the reactor volume forces the reactant gas through the porous structures. A carbon matrix is deposited within the porous structures by the pressure gradient CVI/CVD process. The porous structures may be subjected to heat treatment, if desired. The heat treatment may occur in the middle of the pressure gradient CVI/CVD process or after the pressure gradient CVI/CVD process is completed. The heat treatment step may also be skipped. The heat treatment process is conducted at a higher temperature than the previous deposition process temperatures which increases graphitization of the first carbon matrix. Following the pressure gradient CVI/CVD process, the porous structures are removed from the furnace and surface machined in order to derive an accurate bulk density measurement. The densified structures are machined into final parts. In the present invention, there is no need for multiple CVI/CVD densification steps or for intermediate machining or rearranging the structures during the CVI/CVD densification process. In a certain embodiment, the pressure gradient CVI/CVD process and conventional CVI/CVD process are conducted at about 1700°-2000° F., and heat treatment is conducted at about 3000°-4000° F.

Figure 11:
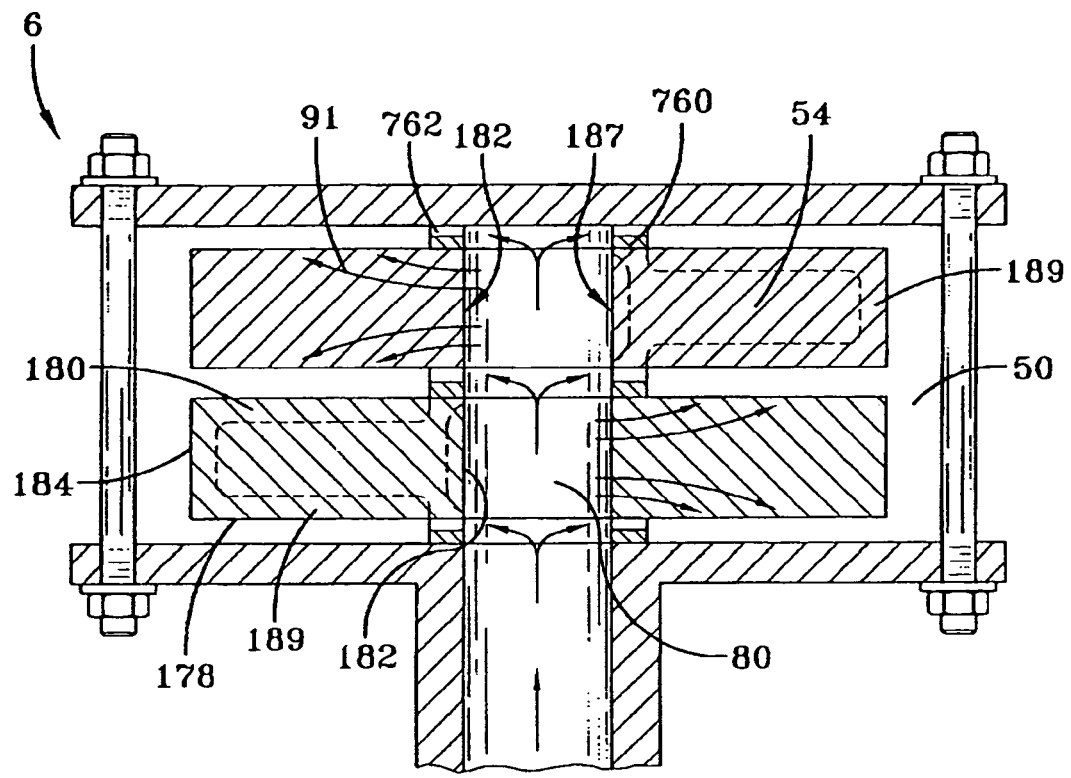
FIG. 11 shows a sectional view of a fixture with porous structures and ID spacers.

Referring now to FIG. 11, another fixture 6 that may be used for an alternative pressure gradient CVI/CVD process is presented. The fixture 6 utilizes all "ID" pass-through spacers 760 resulting in only the inner circumferential surface 182 of each porous structure being subjected to the pressure of inner volume 80. Gas flows through the slots 762 in pass-through spacers 760 due to the pressure difference between inner volume 80 and reactor volume 50. Thus, a first portion 187 of porous structure 54 is subjected to a greater pressure than a second portion 189 resulting in pressure driven flow of the reactant gas through the porous structures 54 as indicated by arrows 91. In this example, the first portion 187 includes the inside circumferential surface 182, and the second portion 189 includes the outside circumferential surface 184 and two opposing surfaces 178 and 180. The reactant gas tends to quickly flow through the porous structure 54 and exit near the ring-like spacer 760.

Figure 12:
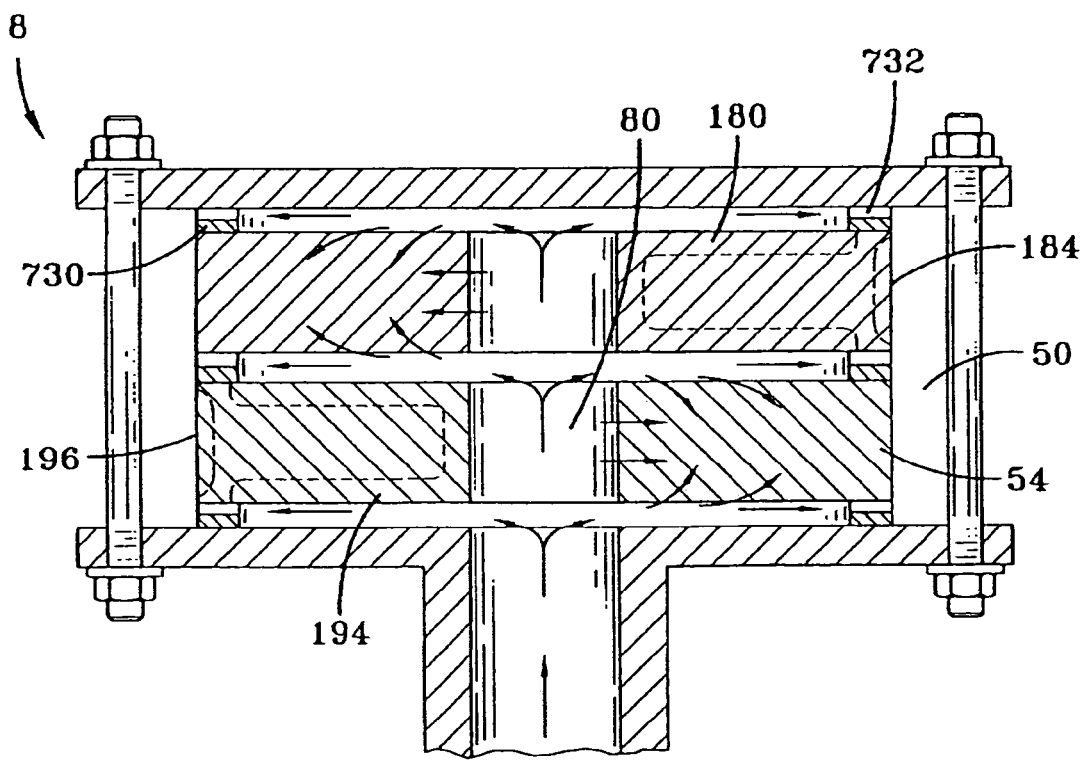
FIG. 12 shows a sectional view of a fixture with porous structures and OD spacers.

FIG. 12 depicts a fixture 8, similar to fixture 750 in FIG. 5. The fixture 8 utilizes all "OD" pass-through spacers 730 resulting in the inside circumferential surface 182 and the opposing surfaces 178 and 180 of each porous structure being subjected to a greater pressure than reactor volume 50. Gas flows through the slots 732 in pass-through spacers 730 due to the pressure difference between inner volume 80 and reactor volume 50. The outside circumferential surface 184 is subjected to the pressure of the reactor volume 50. Thus, a first portion 194 of porous structure 54 is subjected to a greater pressure than a second portion 196 resulting in pressure driven flow of the reactant gas through the porous structures 54 as indicated by arrows 198. In this example, the first portion 194 includes the inside circumferential surface 182 and the opposing surfaces 178 and 180, and the second portion 196 includes the outside circumferential surface 184. As depicted, the reactant gas is forced to disperse through all of the porous structure 54.

Figure 13:
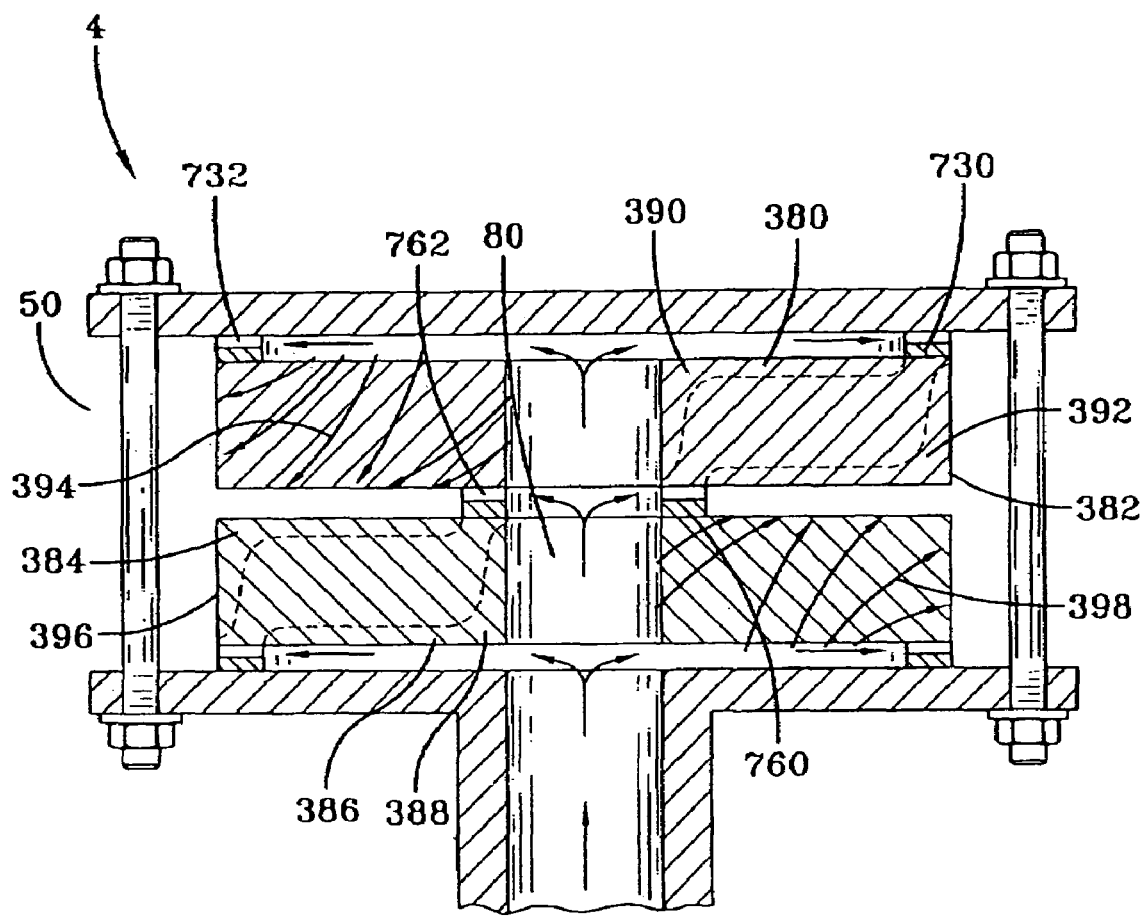
FIG. 13 shows a sectional view of a fixture with porous structures and ID and OD spacers.

FIG. 13 depicts a fixture 4, similar to fixture 300 in FIG. 8. The fixture 4 utilizes both "OD" pass-through spacers 730 and "ID" pass-through spacers 760 resulting in the inside surfaces 380 and 386 of the porous structures being subjected to a greater pressure than reactor volume 50. Gas flows through the slots 732 in pass-through spacers 730 and through slots 762 in pass-through spacers 760 due to the pressure difference between inner volume 80 and reactor volume 50. The outside surface 382 is subjected to the pressure of the reactor volume 50. Thus, a first portion 390 of porous structure 54 is subjected to a greater pressure than a second portion 392 resulting in pressure driven flow of the reactant gas through the porous structures 54 as indicated by arrows 394. Similarly, the outside surface 396 is subjected to the pressure of the reactor volume 50. Thus, a first portion 388 of porous structure 54 is subjected to a greater pressure than a second portion 384 resulting in pressure driven flow of the reactant gas through the porous structures 54 as indicated by arrows 398.

In one embodiment, additional steps are taken in order to ensure maximum efficiency of the process. In one embodiment, spacers are either CVD coated or graphite paint coated to prevent hard bonding of spacer surfaces to the part surfaces. The porous structures are designed with dimensions close to those of the final product, to minimize final part density gradients and machining losses. In order to ensure 100% machining clean-up on all part surfaces, special consideration is given to placement of spacers and spacer blocks on the parts' wear surfaces. Spacer blocks are small structures of similar material to the spacers and are used to help support the positioning of the porous structures. Spacers and spacer blocks are designed near optimum dimensions, enough to provide adequate sealing and minimize surface coverage, to prevent low density regions in the porous structure directly below the spacer. To minimize the adverse effect of spacer indentation into the wear faces, spacer dimensions are such that the planned ID and OD surface machining of the part would remove most of these spacer contact areas. Where OD type spacers (like spacers 310 in FIG. 8) are used, spacer blocks are positioned near the inside diameter of the porous structures. Where ID type spacers (like spacers 320 in FIG. 8) are used, spacer blocks are positioned near the outside diameter of the porous structures. The spacer blocks prevent warpage of the porous structures and distribute the load of the stack more evenly.

The various components of fixtures 4, 6, and 8 are preferably formed from graphite, but any suitable high temperature resistant material may be used in the practice of the invention. In one embodiment, the spacers and spacer blocks are made from a flexible, compressible graphite-like foil material known as Grafoil®. The Grafoil® material prevents the spacers and spacer blocks from CVD bonding to the part wear surfaces (and therefore causing these areas of the part to be peeled off upon spacer removal) and minimize indentation as well. The Grafoil® spacers and spacer blocks are easily separated from the parts upon load break-down, leaving the part surfaces intact.

The various joints may be sealed using compliant gaskets and/or liquid adhesives such as a graphite cement. The porous structures may be pressed against the ring-like spacers to form appropriate seals if the porous structures are compliant before densification. Suitable compliant gaskets may be formed from a flexible graphite such as Grafoil®, EGC Thermafoil® brand flexible graphite sheet and ribbon-pack available from EGC Enterprises Incorporated, Mentor, Ohio, U.S.A. Comparable materials are available from UCAR Carbon Company Inc., Cleveland, Ohio, U.S.A.

EXAMPLE 1

A fibrous textile structure was manufactured according to FIGS. 1 through 4 of U.S. Pat. No. 4,790,052 starting with a 320K tow of unidirectional polyacrylonitrile fiber. An annular porous structure was then cut from the textile structure. The annular porous structure was then pyrolyzed to transform the fibers to carbon. The pyrolyzed porous structure, having a bulk density of 0.40 to 0.50 g/cm$^3$, was then placed in a furnace similar to furnace 40 of FIG. 1.

A furnace run demonstrated a 34-day total process time for commercial-size production-type preforms. A total of four leak path, or pass-through, locations were employed, up the height of the stack of parts. Each pass-through location consisted of pass-through spacers similar to spacer 600 in FIG. 6A. The spacer was composed of carbon or graphite and included 36 equally spaced ⅛" diameter radial holes. Each ring had a total open area (i.e. area available for gas flow) of 0.44 in$^2$, for a total of 4×0.44=1.76 in$^2$ pass-through area per stack of parts. These pass-through spacers were located at regular intervals up the height of the stack, near the bottom of each unit up the height of the stack (4 units in one stack). The stack was of similar configuration as stack 500 in FIG. 9, but included four units of stack design 650 of FIG. 4. In the run, sufficient weight was placed on the top stack-plate to allow for a maximum stack pressure of 50 torr. At the start of the run, at a stack pressure of 22 torr and average part temperature of 1860° F., the average gas residence time at the top of the stack was 0.44 seconds, taking into account the gas by-passed to the outside of the stack, and using the void volume inside the stack. This residence time increased to 1 second towards the end of the run due to the increase in stack pressure to approximately 50 torr.

In addition to stack hardware, CVD process parameters are important factors for a successful single cycle to final density process. Gas flow was maintained at 300 to 600 standard cubic ft/hr (scfh) per stack of porous structures, with gas mixtures of 5-20% reactant gases in natural gas, part temperatures of 1800 to 1900° F., and vessel pressures of 5-15 torr. Archimedes density/porosity revealed desirable densification of the porous structures, in the form of 1.80 g/cc bulk density with 5-6% open porosity, and an impervious density of 1.90 g/cc. This stack hardware design coupled with these process parameters, effectively densified parts to or near final density in only one uninterrupted CVD run. Extensive CT scanning on these parts revealed desirable density gradients in the three principle directions—circumferential, radial, and through the thickness. This final product had similar properties to products from existing multi-cycle CVI/CVD processes.

EXAMPLE 2

Except where noted below, the process conditions were identical to those in Example 1. In this approach, the spacers were of the pass-through spacer design 700 shown in FIG. 7. The spacers 700 included a 0.10-inch deep×0.125-inch wide slot every 45° around the entire ring, for a total of eight slots per ring. These rings were used on every wear surface of every part. Each ring had a total open area (i.e. area available for gas flow) of 0.10 in$^2$; for the 52 parts in the stack, this equated to 0.10×56=5.6 in$^2$ total pass-through area per stack of parts. Thus, the stack was similar to the stack design 750 depicted in FIG. 5. A bottom pressure release system was employed to vent at 50 torr stack pressure. The bottom pressure release was similar to that depicted in FIG. 3 and involved channels 350 drilled through the bottom base plate 72, from the base plate aperture 252 to the reactor volume 50 outside of the stack. A small graphite disk lined with Grafoil® was cut to the desired weight, lined with Grafoil® to prevent sticking, and placed over each of the channels outlets 352. Guide pins encircled each hole to keep the graphite disk centered over each hole. Thus, when 50 torr stack pressure was reached, gas was vented from the bottom to the outside of the stack instead of the venting from inside the stack, at the top of the stack and out through the exhaust stack in the susceptor lid.

At the start of the run, at a stack pressure of 16 torr and average part temperature of 1860° F., the average gas residence time inside the stack was 0.20 seconds, not taking into account the gas by-pass to the outside of the stack, and using the void volume inside the stack. This residence time increased to 0.75 seconds at the end of the run due to the increase in stack pressure to approximately 50 torr and due to the bottom gas venting to the outside of the stack.

Archimedes density/porosity revealed desirable densification properties, in the form of 1.80 g/cc bulk density with 5-7% open porosity, and an impervious density of 1.90-1.93 g/cc. The aforementioned stack hardware design coupled with these process parameters, effectively densified parts to or near final density in only one uninterrupted CVD run. Extensive CT scanning on these parts revealed desirable density gradients (post-run) in the three principle directions—circumferential, radial, and through the thickness. This final product had similar properties to products from existing multi-cycle CVI/CVD processes.

EXAMPLE 3

Except where noted below, the process conditions were identical to those in Example 1. In the approach, standard spacers were modified to include a 0.12-inch deep×0.1875-inch wide slot every 45° around the entire ring, for a total of eight slots per spacer. These spacers were similar to the spacer design 700 in FIG. 7A. These spacers were used on every wear surface of every part. Each ring had a total open area (i.e. area available for gas flow) of 0.18 in$^2$; for the 52 parts in the stack, this equated to 0.18×56=10.1 in$^2$ total pass-through area per stack of parts. Sufficient weight was placed on the top stack-plate to allow for a maximum designed stack pressure of 50 torr. At the start of the run, at a stack pressure of 11-12 torr and average part temperature of 1860° F., the average gas residence time inside the stack was 0.14 seconds, not taking into account the gas by-pass to the outside of the stack, and using the void volume inside the stack. However, the part density results suggest that the 50 torr designed maximum stack pressure may not have been reached. The parts in the top portion of the stack displayed higher densities than those in the bottom portion. Since the parts in the top portion of the stack experience higher effective gas residence time, due to the increasing amount of gas by-pass to the outside of the stack, it was theorized that too low a gas residence time existed in the bottom portion of the stack.

Visual appearance of these parts did not indicate excessive formation of "seal-coat" on external surfaces of the porous structures. Archimedes density/porosity revealed desirable densification properties on parts in the top half of the stack, in the form of 1.80 g/cc bulk density with 5-7% open porosity, and impervious density of 1.90-1.92 g/cc. Archimedes results on parts in the bottom half of the stack suggest rough laminar carbon and lower bulk densities/higher open porosities (i.e. 1.71-1.77 g/cc and 7-11% open porosity) than the top stack parts. Extensive CT scanning on these parts revealed desirable density gradients (post-run) in the three principle directions—circumferential, radial, and through the thickness, for parts in the top half of the stack. Parts in the bottom half of the stack, however, displayed high density gradients in the ID to OD direction (i.e. radial direction), in the 0 to 360° direction (i.e. circumferential), and through the thickness.

EXAMPLE 4

Except where noted below, the process conditions were identical to those in Example 1. The standard spacers were modified to include a 0.10-inch deep×0.125-inch wide slot every 45° around the entire ring, for a total of eight slots per spacer. (These are hence referred to as "OD" spacers.) Spacers were also fabricated to fit around the parts' ID circumference as well. These spacers contained a 0.12-inch deep×0.1875-inch wide slot every 45° around the ring, for a total of eight slots per spacers. (These are hence referred to as "ID" spacers.) These ID and OD spacers were used in an alternating fashion, on every wear surface of every part, in a fashion similar to fixture 300 in FIG. 8. Each OD ring had a total open area (i.e. area available for gas flow) of 0.10 in$^2$; each ID ring had a total open area of 0.18 in$^2$. For the 52 parts in the stack, this equated to 0.10×28+0.18×28=7.8 in$^2$ total pass-through area per stack of parts.

At the start of the run, at a stack pressure of 13.5 torr and average part temperature of 1860° F., the average gas residence time inside the stack was 0.15 seconds, not taking into account the gas by-pass to the outside of the stack, and using the void volume inside the stack. This residence time increased during the run as the stack pressure increased. However, the part density results suggest that the 50 torr designed maximum stack pressure may not have been reached. The parts in the top portion of the stack displayed higher densities than those in the bottom portion. Since the parts in the top portion of the stack experience higher effective gas residence time, due to the increasing amount of gas by-pass to the outside of the stack, it was theorized that too low a gas residence time existed in the bottom portion of the stack.

Visual appearance of these parts did not indicate excessive formation of "seal-coat" on external surfaces. Archimedes density/porosity revealed desirable densification properties on parts in the top quarter of the stack, in the form of 1.79 g/cc bulk density with 7-9% open porosity, and an impervious density of 1.94-1.96 g/cc. Archimedes results on parts in the bottom three-fourths of the stacks suggest rough laminar carbon and lower bulk densities/higher open porosities (i.e. 1.67-1.74 g/cc and 10-15% open porosity) compared to the parts in the top quarter of the stack. It appears that the aforementioned stack hardware design coupled with these process parameters, effectively densified parts to or near final density in the top portion of the stack, in this one uninterrupted CVD run. Extensive CT scanning on these parts has revealed somewhat desirable density gradients (post-run) in the three principle directions—circumferential, radial, and through the thickness, for parts in the top quarter of the stack. Parts in the bottom three-fourths of the stack, however, displayed high density gradients in the radial, circumferential, and through-the-thickness directions. Of particular concern was the existence of low density regions at the ID-ring wear surfaces; OD-ring wear surfaces did not exhibit this low density phenomenon.

EXAMPLE 5

Except where noted below, the process conditions were identical to those in Example 1. In this approach, the standard spacers were utilized, along with a modified spacer placed at the bottom of the stack. This modified spacer consisted of 36 equally spaced radial holes (i.e. one hole every 10°), each at a hole diameter of ³⁄₁₆-inch, similar to spacer 600 in FIG. 6A. Total area for pass-through to the OD of the stack was 0.0276×36=0.994 in². Sufficient weight was placed on the top stack-plate to allow for a maximum designed stack pressure of 50 torr. At the start of the run, at a stack pressure of 25 torr and average part temperature of 1860° F., the average gas residence time in the stack was 0.39 seconds, taking into account the approximate of gas by-passed to the outside of the stack, and using the void volume inside the stack. This residence time increased to 0.77 seconds towards the end of the due to the increase in stack pressure to approximately 50 torr. The parts in the bottom portion of the stack displayed higher densities than those in the middle and top portion. Since the parts in the middle and top portion of the stack experience higher effective gas residence time, due to the increasing amount of gas that goes outside the stack (through the parts) from bottom to top, it is theorized that too high a gas residence time existed in the top portion of the stack.

Visual examination of bottom parts did not indicate excessive formation of "seal-coat" on external surfaces. However, the extent of outer seal-coat/soot build-up did increase with stack height. Archimedes density/porosity revealed moderately desirable densification properties on parts in the bottom third of the stack, in the form of 1.76-1.79 g/cc bulk density with 6-7% open porosity, and an impervious density of 1.86-1.90 g/cc. Archimedes results on parts in the top two-thirds of the stack suggest existence of smooth laminar carbon and lower bulk densities/lower open porosities (i.e. 1.69-1.74 g/cc and 4-7% open porosity), compared to the parts in the bottom third of the stack. It appears that the aforementioned stack hardware design coupled with these process parameters, effectively densified parts to or near final density in the bottom portion of the stack only, in this one uninterrupted CVD run. Extensive CT scanning on these parts has revealed moderately desirable density gradients (post-run) in the three principle directions—circumferential, radial, and through the thickness, for parts in the bottom third of the stack.

The embodiments described above and shown herein are illustrative and not restrictive. The scope of the invention is indicated by the claims rather than by the foregoing description and attached drawings. The invention may be embodied in other specific forms without departing from the spirit of the invention. Accordingly, these and any other changes which come within the scope of the claims are intended to be embraced therein.

What is claimed is:

1. A process for densifying porous structures inside a furnace, the process comprising:
   providing a furnace, the furnace defining an outer volume;
   assembling a multitude of porous structures and ring-shaped spacers in a stack with a ring-shaped spacer between each adjacent pair of porous structures, wherein at least one of the ring-shaped spacers comprises a plurality of channels;
   disposing the stack of porous structures between a bottom plate and a top plate in the furnace, wherein the bottom plate, the stack of porous structures, and the ring-shaped spacers define an enclosed cavity extending from the bottom plate, including each porous structure aperture, and terminating proximate the top plate;
   providing fluid communication between the enclosed cavity and the outer volume through the plurality of channels in the at least one ring-shaped spacer;
   allowing a gas to flow through the channel while maintaining a pressure gradient between the enclosed cavity and the outer volume; and
   densifying the porous structures from an average density of less than 0.60 g/cm³ to an average density of greater than 1.70 g/cm³ in a single cycle of pressure gradient CVI/CVD.

2. The process of claim 1 wherein at least one of the ring-shaped spacers comprises a radially oriented channel providing fluid communication between the enclosed cavity and the outer volume.

3. The process of claim 1 wherein the porosity of the porous structures after densification is less than 15%.

4. The process of claim 1 further comprising the step of regulating the pressure differential between the enclosed cavity and the outer volume so that it does not exceed a predetermined value.

5. The process of claim 1 further comprising the steps of providing a bottom pressure release between the enclosed cavity and the outer volume, and
   releasing gas through the bottom pressure release when a pressure differential between the enclosed cavity and the outer volume reaches a predetermined value.

6. The process of claim 5 wherein the predetermined pressure differential value is between 10 and 40 torr.

7. The process of claim 1 further comprising the step of placing a plurality of spacer blocks between the porous structures, wherein spacer blocks are placed near the outer diameter of a porous structure if an inner-diameter type spacer is used, and wherein spacer blocks are placed near the inner diameter of a porous structure if an outer-diameter type spacer is used.

8. The process of claim 1 wherein the pressure in the enclosed cavity is at least about 11 torr.

9. The process of claim 1 wherein the pressure in the enclosed cavity is at least about 16 torr.

10. The process of claim 1 wherein the pressure in the enclosed cavity is between about 11 torr and about 50 torr.

11. The process of claim 1 wherein the gas comprises between 5% and 20% reactant gases.

12. The process of claim 1 wherein the pressure in the outer volume is between 5 and 15 torr.

13. A process for densifying porous structures inside a furnace, the process comprising:

providing a furnace, the furnace defining an outer volume;

assembling a multitude of porous structures and ring-shaped spacers in a stack with a ring-shaped spacer between each adjacent pair of porous structures, wherein a majority of the ring-shaped spacers comprises at least one channel;

disposing the stack of porous structures between a bottom plate and a top plate in the furnace, wherein the bottom plate, the stack of porous structures, and the ring-shaped spacers define an enclosed cavity extending from the bottom plate, including each porous structure aperture, and terminating proximate the top plate;

introducing a reactant gas into the enclosed cavity;

introducing a portion of the reactant gas into the outer volume while maintaining a pressure gradient between the enclosed cavity and the outer volume, wherein the at least one channel in at least one of the ring-shaped spacers provides fluid communication between the enclosed cavity and the outer volume; and densifying the porous structures from an average density of less than 0.60 g/cm$^3$ to an average density of greater than 1.70 g/cm$^3$ in a single cycle of pressure gradient CVI/CVD.

14. The process of claim 13 wherein a concentration of reactant gas in the enclosed cavity is greater than a concentration of reactant gas in the outer volume.

15. The process of claim 13 wherein at least some of the ring-shaped spacers comprise a radially oriented channel providing fluid communication between the enclosed cavity and the outer volume.

16. The process of claim 13 wherein the pressure in the enclosed cavity is at least about 11 torr.

17. The process of claim 13 wherein the pressure in the enclosed cavity is at least about 16 torr.

18. The process of claim 13 wherein the pressure in the enclosed cavity is between about 11 torr and about 50 torr.

19. The process of claim 13 wherein the pressure in the outer volume is between 5 and 15 torr.

* * * * *

UNITED STATES PATENT AND TRADEMARK OFFICE
CERTIFICATE OF CORRECTION

| | | |
|---|---|---|
| PATENT NO. | : 7,335,397 B2 | Page 1 of 1 |
| APPLICATION NO. | : 10/780265 | |
| DATED | : February 26, 2008 | |
| INVENTOR(S) | : James W. Rudolph et al. | |

It is certified that error appears in the above-identified patent and that said Letters Patent is hereby corrected as shown below:

In the Claims

Column 19, claim 7, line 4, before "of a porous structure" delete "inner diameter" and substitute --inner-diameter-- in its place.

Signed and Sealed this

Nineteenth Day of August, 2008

JON W. DUDAS
*Director of the United States Patent and Trademark Office*